(12) United States Patent
Ezaki et al.

(10) Patent No.: US 7,230,843 B2
(45) Date of Patent: Jun. 12, 2007

(54) MAGNETIC MEMORY DEVICE AND WRITING METHOD OF THE SAME

(75) Inventors: Joichiro Ezaki, Tokyo (JP); Yuji Kakinuma, Tokyo (JP); Keiji Koga, Tokyo (JP); Shigekazu Sumita, Tokyo (JP)

(73) Assignee: TDK Corporation, Tokyo (JP)

( * ) Notice: Subject to any disclaimer, the term of this patent is extended or adjusted under 35 U.S.C. 154(b) by 3 days.

(21) Appl. No.: 10/550,201

(22) PCT Filed: Mar. 26, 2004

(86) PCT No.: PCT/JP2004/004357

§ 371 (c)(1),
(2), (4) Date: Oct. 31, 2005

(87) PCT Pub. No.: WO2004/088752

PCT Pub. Date: Oct. 14, 2004

(65) Prior Publication Data

US 2006/0098478 A1    May 11, 2006

(30) Foreign Application Priority Data

Mar. 28, 2003   (JP) .............................. 2003-092841

(51) Int. Cl.
*G11C 11/14* (2006.01)
(52) U.S. Cl. .................. 365/171; 365/158; 365/173
(58) Field of Classification Search ................ 365/171, 365/158, 173
See application file for complete search history.

(56) References Cited

U.S. PATENT DOCUMENTS

| | | | | |
|---|---|---|---|---|
| 5,732,016 | A * | 3/1998 | Chen et al. ................ | 365/158 |
| 6,943,394 | B2 * | 9/2005 | Yoshihara et al. ......... | 257/295 |
| 7,016,221 | B2 * | 3/2006 | Ezaki et al. ............... | 365/158 |
| 2002/0141232 | A1 | 10/2002 | Saito et al. | |
| 2002/0154540 | A1 | 10/2002 | Sekiguchi et al. | |
| 2006/0120147 | A1 * | 6/2006 | Peng et al. ................ | 365/158 |

FOREIGN PATENT DOCUMENTS

| | | |
|---|---|---|
| JP | A 2001-273759 | 10/2001 |
| JP | A 2002-289807 | 10/2002 |
| JP | A 2003-132670 | 5/2003 |
| JP | A 2004-111887 | 4/2004 |
| JP | A 2004-119638 | 4/2004 |

* cited by examiner

*Primary Examiner*—Anh Phung
(74) *Attorney, Agent, or Firm*—Oliff & Berridge, PLC

(57) ABSTRACT

The present invention provides a magnetic memory device based on a novel driving method realizing reliable writing and a method of writing the magnetic memory device. Four parallel portions are formed in a pair of loop-shaped write lines (6Xn) and (6Yn). Magnetoresistive devices (12A) and (12B) disposed in the parallel portion in an upper stage construct a memory cell (12Ev), and magnetoresistive devices (12A) and (12B) disposed in the parallel portion in a lower stage construct a memory cell (12Od). When current in the direction from the drive point A to the drive point B is passed from the current drives (123n) and (133n), the directions of the currents in the write lines (6Xn) and (6Yn) are aligned in the parallel portion of the memory cell (12Ev) but are opposite to each other in the parallel portion in the memory cell (12Od). In the memory cell (12Ev), induced magnetic fields enhance each other, and the magnetization directions of the magneto-sensitive layers of the magnetoresistive devices (12A) and (12B) are anti-parallel with each other. In the memory cell (12Od), the induced magnetic fields cancel each other out.

21 Claims, 29 Drawing Sheets

|  | Ao | Din | XDin | YDin |
|---|---|---|---|---|
| WRITE "1" TO MEMORY CELL 12Ev | 0 | 1 | 1 | 1 |
| WRITE "0" TO MEMORY CELL 12Ev | 0 | 0 | 0 | 0 |
| WRITE "1" TO MEMORY CELL 12Od | 1 | 1 | 0 | 1 |
| WRITE "0" TO MEMORY CELL12Od | 1 | 0 | 1 | 0 |

MAGNETIC MEMORY DEVICE AND WRITING METHOD OF THE SAME

TECHNICAL FIELD

The present invention relates to a magnetic memory device constructed by using a magnetoresistive device including a ferromagnetic material and for writing and storing information by controlling the magnetization direction of the ferromagnetic material, and to a writing method of the magnetic memory device.

BACKGROUND ART

Increase in the speed of information processing in a computer, a mobile communication device, and the like matches the trend aiming at so-called ubiquitous computing and is becoming more and more important. It accompanies strong demand for development of a higher-speed nonvolatile memory. As a memory replacing a conventional flash EEPROM, a hard disk device, and the like, an MRAM (Magnetic Random Access Memory) is regarded as a promising memory.

In the MRAM, each of memory cells arranged in a matrix is constructed by a magnetic device. The MRAM currently used in practice utilizes the giant magneto-resistive (GMR) effect. The GMR effect is a phenomenon such that in a stacked body in which two ferromagnetic layers are disposed so that their axes of easy magnetization are aligned, in the case where the magnetization directions of the layers are parallel with the axis of easy magnetization, the resistance value of the stacked layer becomes the minimum. In the case where the magnetization directions are anti-parallel with the axis of easy magnetization, the resistance value becomes the maximum. In each of the memory cells, by making the two states correspond to binary information of "0" and "1", information is stored. By detecting the resistance which varies according to information as a change in current or voltage, information is read. In an actual GMR device, two ferromagnetic layers are stacked sandwiching a nonmagnetic layer. One of the two ferromagnetic layers is a pinned layer whose magnetization direction is pinned, and the other is a free layer (magneto-sensitive layer) whose magnetization direction can change according to an external magnetic field.

On the other hand, in a magnetic device using a tunneling magneto-resistive (TMR) effect, the resistance change rate can be made much higher than that of the GMR device. The TMR effect is a phenomenon such that the value of tunnel current passing through an insulating layer changes in accordance with relative angles of the magnetization directions of two ferromagnetic layers (a pinned layer and a free layer) stacked while sandwiching a very-thin insulating layer. That is, the tunnel current becomes the maximum (the resistance value of the device is the minimum) when the magnetization directions of the two ferromagnetic layers are parallel with each other, and becomes the minimum (the resistance value of the device is the maximum) when the magnetization directions are anti-parallel with each other. Based on the principle, there is a TMR device whose resistance change rate reaches 40% or higher. Since the resistance of the TMR device is high, it is said that matching with MOSFET (Metal Oxide Semiconductor Field Effect Transistor) is easy. From the above advantages, the TMR-MRAM can easily obtain a higher output, and improvement in storage capacity and access speed is expected.

Those MRAMs write information by similar methods although their types of elements are different from each other. Specifically, current is passed to a write line to introduce a magnetic field, and the magnetization direction of the free layer is controlled by the current magnetic field. By the control, the relative magnetization directions of the ferromagnetic layers become parallel or anti-parallel with each other, and corresponding binary information is stored.

For example, a conventional TMR-MRAM has the following configuration. As shown in FIG. 24, a bit line 201 and a write word line 202 extending linearly are orthogonal to each other. In an area of a dotted line using, as a unit, a TMR device 205 (expressed as a resistor in the circuit) disposed at each of the intersecting areas of the bit line 201 and the write word line 202, a memory cell is constructed. The bit line 201 is a line commonly used for writing and reading, functions as a cell selection line in the bit direction at the time of writing, and functions as a sense line at the time of reading. To each of the bit lines 201, the source and drain of a bit selecting transistor 204 are connected. Current flows to the bit line 201 only when the bit line 201 is selected by a bit decode value input to the gate terminal. Similarly, current flows to the write word line 202 only when the write word line 202 is selected according to a word decode value. Therefore, in a selected cell at the time of writing, current flows in both of the bit line 201 and the write word line 202.

For reading operation, one end of the TMR device 205 is connected to the bit line 201, and the other end is grounded via a cell selecting transistor 206. The gate terminal of the cell selecting transistor 206 is connected in parallel with a read word decode line 203 provided for each cell word line. Therefore, in a selected cell at the time of reading, sensing current supplied from the bit line 201 passes through the TMR device 205 and the cell selecting transistor 206 and flows to the ground.

FIG. 25 shows a sectional structure of a memory cell seen from the direction of the arrow A in FIG. 24. The TMR device 205 is a stacked body of a pinned layer 207, an insulating layer 208, and a free layer 209. The magnetization of the pinned layer 207 is fixed in the direction shown in the diagram, and the magnetization of the free layer 209 can be inverted in both of the directions shown in the diagram. A write state of the TMR device 205 is determined by the relative magnetization directions of the free layer 209 and the pinned layer 207, that is, the magnetization direction of the free layer 209. However, conventionally, at the time of writing, current is passed to the bit line 201 and the write word line 202 to induce the magnetic fields into two directions to the free layer 209.

The operation is based on the theory of switching magnetic fields, in which when a synthetic magnetic field vector of magnetic fields Hx and Hy exceeds the region specified by a closed curve (so-called asteroid curve) shown in FIG. 26, the magnetization direction of the free layer 209 can be changed by the synthetic magnetic field. The free layer 209 in this case is a thin film having uniaxial magnetic anisotropy and has a single magnetic domain structure. It is assumed that magnetization inversion occurs by simultaneous turn. The magnetic fields Hx and Hy are magnetic field components in the direction of the axis of hard magnetization and the direction of the axis of easy magnetization of the free layer 209. When the synthetic magnetic field is applied in the direction at the angle $\phi$ with respect to the axis of easy magnetization in the film surface of the free layer 209, the magnetization is at the angle satisfying $0<\theta<\phi$ at which torque received from the magnetic field and torque toward the axis of easy magnetization by magnetic anisotropy are equal to each other. The critical magnetic field in magnetization switching is expressed by the curve of FIG. 26 (Hsw denotes the threshold of the application magnetic field which enables magnetization inversion). The process of specifying each of the directions of matrix electrode wiring by inputting an address and unconditionally selecting a desired cell is according to the principle of the matrix driving method.

In the matrix driving method, generally, auxiliary cell selection that makes a predetermined cell line half-selected is performed by using a selection line. By giving a data signal exceeding an operation threshold to a data line, a single cell is selected from the half-selected cells. The state is controlled according to data. Memories other than the MRAM and a digitally-driven display are also designed on the basis of such an operation principle. With respect to this point as well, a conventional MRAM is not exceptional but is driven based on a similar principle. Specifically, current is passed in the direction of blank arrows in FIGS. 24 and 25 to the bit line 201 to make the bias magnetic fields Hx generate in a predetermined direction, and a corresponding bit line is half-selected. On the other hand, current is passed in the direction according to data out of the both directions to the write word line 202 to make the magnetic fields Hy or the inversion magnetic fields −Hy corresponding to the magnetization direction of the free layer 209 generate. In such a manner, the magnetization direction control according to data is selectively performed on a cell in the corresponding word line in the half-selected bit line.

Since the bit line 201 is used for detecting weak voltage or current as a sense line at the time of reading, it is designed as a common line whose current permission value is small. The amount of current passed at the time of writing is also small. That is, the magnetic field Hx is relatively small and is regarded as a bias magnetic field whose direction is fixed and which is applied for selecting a cell.

On the other hand, in recent years, cell structures aiming at improvement in write efficiency have been proposed. For example, as shown in FIG. 27, a technique of introducing a closed magnetic circuit structure to a memory cell 211 to reduce the influence of a demagnetizing field at an end of a free layer 214 and stabilize the magnetization of the memory cell 211 is disclosed (refer to Japanese Patent Laid-Open No. 2001-273759). The memory cell 211 has a pinned layer 212, an insulating layer 213, the free layer 214, and a closed magnetic circuit layer 215 which are stacked. The closed magnetic circuit layer 215 promotes magnetization inversion of the free layer 214 and also contributes to stabilize the magnetization against an external leak magnetic field. Therefore, reduction in size of the memory cell 211 can be realized. For example, a technique of bending write lines as shown in FIG. 28 to shorten the minimum cycle of the write lines, thereby realizing higher packing density is proposed. In the diagram, a word line 217 has a linear shape and a bit line 216 is bent.

A similar wiring structure is also disclosed in Japanese Patent Laid-Open No. 2002-289807 (FIG. 29). In this case, a write line 221 is bent with a wiring width of "a" and a bent-portion length of "b", and the relative directions of write current flowing in the portion and write current in the write line 222 are controlled. In such a manner, as shown in FIG. 30, an induced magnetic field H1 by the write current in the write line 221 is generated at an angle $\theta = \tan^{-1}(b/a)$ relative to an induced magnetic field H2 by the write current in the write line 222 in order to make a resultant vector H12 of the magnetic fields H1 and H2 larger than that in the case where the magnetic fields are orthogonal to each other.

The inventors of the present invention, however, have noticed that if a conventional wiring structure and a convention writing method are employed in the case of disposing write lines in the memory cells almost parallel to each other as described above, there is the possibility that reliable writing is not performed.

In a conventional MRAM circuit, since it is necessary to pass write current in the inverted direction in accordance with data to the write word line 202, by giving a positive pulse or negative pulse, current can be passed in both directions. In contrast, to the bit line 201, write current is supplied only in one direction to give the fixed bias magnetic field Hy. Moreover, the bit line 201 has the structure in which current can be passed always only in one direction (the direction of the blank arrows in FIGS. 24 and 25).

If a negative pulse voltage is applied to the bit line 201 to pass current in the direction opposite to that shown by the blank arrow in FIG. 24, the current passes through the cell selection transistor 206 of each of cells connected to the bit line 201. Specifically, the cell selection transistor 206 is generally an enhancement-mode MOS transistor and the gate voltage of the cell selection transistor 206 in an off state for writing operation is supposed to be 0V or negative potential at this time. If the negative pulse is applied to the drain side in this case, since the gate has the same potential of 0V as that on the source side or a higher potential, the inherent function of the source and that of the drain are reversed, and current flows from the source to the drain.

When the magnetic fields H1 and H2 are applied as shown in FIG. 30 by applying such a conventional circuit configuration and a conventional driving method, as shown in FIG. 31, an inverted magnetic field vector −H12 obtained by the magnetic fields H1 and −H2 is not symmetrical with the magnetic field vector H12 with respect to the axis of easy magnetization of the free layer 209, and the magnitude of the inverted magnetic field vector −H12 is smaller than that of the magnetic field vector H12. Consequently, binary information cannot to be written in an equivalent state and, moreover, there is the possibility that binary information cannot be written reliably.

As described above, even if the structure of the write line is improved, when the improved structure is simply fit in a conventional circuit configuration, the resultant structure cannot be practically used. On the other hand, under present circumstances, improvement in a whole configuration of a circuit has not been progressed and the configuration of the MRAM and the principle of driving have not been largely changed from the conventional ones. In view of the circumstances, the inventors of the present invention have concluded that it is necessary to improve an MRAM as a memory which can be actually driven and, for this purpose, to improve not only a write line in a conventional circuit but also a whole memory structure including a read circuit system in order to achieve the object.

DISCLOSURE OF THE INVENTION

The present invention has been achieved in consideration of the problems and an object of the invention is to provide a magnetic memory device based on a novel driving method realizing reliable writing operation and a writing method of the magnetic memory device.

A magnetic memory device of the preset invention includes: a read line to which read current is passed; first and second write lines disposed separately from the read line so that write current can be passed in two ways to each of the first and second write lines, where a parallel portion in which the first and second write lines extend parallel with each other is formed by bending at least one of the first and second write lines; and a magnetoresistive device having a magneto-sensitive layer whose magnetization direction changes according to a magnetic field applied, and disposed in the parallel portion. At least one of the first and second write lines is formed in a loop shape so as to include a bent portion and first and second portions connecting the bent portion and both ends, the magnetization direction of the magneto-sensitive layer changes according to a magnetic field generated by write current flowing in the parallel portion, and information is written.

In the magnetic memory device, the write line is provided perfectly separate from the read line, so that current can be passed in two ways in both of the first and second write lines. At least one of the write lines is formed in a loop shape by being bent between a first portion and a second portion, and current is circulated. Therefore, currents having the same magnitude and in opposite directions flow in the first and second portions. Further, at least one of the first and second write lines is bent so as to form plural parallel portions extending in parallel with each other, and magnetoresistive devices are disposed in the parallel portions. That is, by supplying the write current controlled in two ways to each of the first and second write lines, the directions of the write currents are aligned in the parallel portions and magnetic fields are generated so as to enhance each other. According to the application magnetic fields, the magnetization directions of the magneto-sensitive layers change. In this case, since at least one of the write lines is formed in a loop shape, plural parallel portions in which the first and second write lines are the same are formed. Therefore, the magnetoresistive device is disposed in a position so that it can be unconditionally selected in correspondence with the direction of the write current and operate properly, and a binary state can be written with reliability. Expression "write lines are parallel with each other" in the present invention includes an error range of ±10° in manufacture.

In the wiring structure of the write line, preferably, (1) the parallel portion is formed by bending one of the first and second portions of the write line into a rectangular wave shape or a trapezoid wave shape, or (2) the parallel portion is formed by bending both of the first and second portions into a rectangular wave shape or a trapezoid wave shape. When the write line is bent in the rectangular wave shape or the trapezoid wave shape, the parallel portion is efficiently provided, and the write currents are supplied in opposite directions to the neighboring magnetoresistive devices from the write line bent. In the case of forming the parallel portion by bending both of the first and second portions of the write line, more preferably, the direction of bending the first portion and that of the second portion coincide with each other. At this time, currents flow in opposite directions in the parallel portion in the first portion and the parallel portion in the second portion which face each other.

In such a magnetic memory device, preferably, one memory cell is constructed by a pair of magnetoresistive devices. That is, one-unit information is stored by using two magnetoresistive devices each capable of storing one-unit information. In this case, information written in the memory cell can be read by a differential reading method.

In the magnetic memory device, preferably, both of the first and second write lines are formed in a loop shape, one of the first and second write lines is bent so that both of the first and second portions have a rectangular wave shape or a trapezoid wave shape, and the bending direction of the first portion and that of the second portion coincide with each other, thereby forming four parallel portions in a pair of first and second write lines. A pair of magnetoresistive devices disposed in the two parallel portions provided in the first portion construct a memory cell belonging to a first group, and a pair of magnetoresistive devices disposed in the two parallel portions provided in the second portion construct a memory cell belonging to a second group. As described above, when both of the first and second write lines are formed in a loop shape and bent as described above, two parallel portions are formed in each of the first and second portions of the bent write line in the pair of first and second write lines. In this case, each of a pair of magnetoresistive devices disposed in each of the parallel portions in the first portion and a pair of magnetoresistive devices disposed in each of the parallel portions in the second portion can be operated separately as a memory cell. Further, a plurality of memory cells are formed by combinations of the first and second write lines. By setting memory cells provided in the first portion into a first group and setting memory cells provided in the second portion into a second group, one memory cell can be selected.

For this purpose, it is preferable to provide a write logic controller for receiving address information indicating the first or second group to which a memory cell to be written belongs and write information to be written, and selecting the direction of write current supplied to the first and second write lines on the basis of the address information and the write information. In the configuration, the memory cells in the first portion and the memory cells in the second portion use the same looped write line. According to a memory cell to be written, the direction of the write current supplied to the first and second write lines varies. Naturally, the direction of the write current also varies according to data to be written. The write logic controller unconditionally determines the direction of write current supplied to the first and second write lines from the two conditions and outputs the resultant.

Preferably, the magnetic memory device further comprises a write current drive circuit including: a current direction controller to which both ends of a write line having a loop shape as one of the first and second write lines are connected and which controls the direction of the write current in the write line in two ways; and a current amount controller for controlling the amount of write current in the write line to a constant value, and supplying the write current to the write line. When such a write current drive circuit is used, by the current direction controller, the direction of the write current is switched in two ways so that current flows in one of both ends of the write line and flows out from the other end and, by the current amount controller, the current amount is controlled to be always constant for a period since the current flows in the write line until the current flows out from the write line. In the magnetic memory device of the preset invention, "connection" denotes at least electric connection, but physical direct connection is not always a condition. In the expression of "controlling the amount of write current to a constant value" in the invention, a write current amount before the write line or at the inflow end is not the target to be controlled, but it denotes a constant current control for controlling the magnitude of the write current to a constant value for the entire write line since the write current flows from an end of the write line until the write current flows out from the other end.

The write current drive circuit is preferably controlled by the write logic controller. That is, the magnetic memory device further comprises a write current drive circuit, the direction of the write current supplied to the first and second write lines selected by the write logic controller is output as direction control information for controlling the current direction to the current direction controller, and the current direction controller controls the direction of the write current in the write line on the basis of the direction control information.

Concretely, the current direction controller includes: a first differential switch pair constructed by first and second current switches provided for both ends of the write line and operating so that one of the first and second current switches is open and the other is close; and a second differential switch pair constructed by third and fourth current switches provided in correspondence with the first and second current switches, respectively, and operating so that one of the third and fourth current switches is open and the other is close. The first differential switch pair has the function of selecting one of both ends of the write line as a write current inflow side, and the second differential switch pair has the function of selecting the other one of the both ends of the write line as a write current outflow side. The open/close state (on/off state) in a general switching element assumes the case where the conductive state (or the state where the amount of current flowing is equal to or larger than a threshold value) is the on state, and a substantial shield state in which current is hardly passed (or the amount of current flowing is less than a threshold value). The on and off states in this case are specified stationarily and each of the states can be digitally identified. In contrast, the "open/close state (on/off state)" of the current switch in the present invention is a concept including not only the two states but also relative two states which occur in the differential operation by the current switches paired as a differential switch pair; the on state in which a larger amount of current is passed and the off state in which a smaller amount of current is passed.

In the current direction controller, the first current switch and the second current switch in the first differential switch pair are in open/close states (on/off states) opposite to each other. At both ends of the write line, the side on which the corresponding current switch is on is conducted so that current is permitted to flow, but the side on which the corresponding current switch is off is blocked so that no current flows. Consequently, the side on which control is performed by the on-state current switch in the first differential switch pair out of both ends of the write line is selected as the write current inflow side. In the second differential switch pair, the third current switch is provided in correspondence with one end of the write line in a manner similar to the first current switch, and the fourth current switch is provided in correspondence with the other end of the write line in a manner similar to the second current switch. The third and fourth current switches are in the operation states opposite to each other, and the second differential switch pair acts in a manner similar to the first differential switch pair. Consequently, the side on which control is performed by the on-state current switch in the second differential switch pair out of both ends of the write line is selected as the write current outflow side. In such a manner, in the current direction controller, the direction of the write current is unconditionally determined.

To make the first and second differential switch pairs cooperate with each other to select the different sides of the write line, for example, the current direction controller may include a differential controller for performing a control so that the first and fourth current switches are in the same open/close state, and the second and third current switches are in the state opposite to the state of the first and fourth current switches.

In such a magnetic memory device, preferably, magnetic fields generated by the write current supplied to the first and second write lines are applied to the magneto-sensitive layer so as to be in the same direction in the memory cell to be written. For example, by disposing the magnetoresistive device in an area where a magnetic field is generated only in a direction orthogonal to the parallel portion, in the parallel portion of the write lines, the magnetic fields induced to the write current can be made parallel with each other and their directions can be aligned in a single direction. When a magnetoresistive device becomes an object to be written, current is supplied so that the directions are aligned in the parallel portion where the magnetoresistive device is disposed. The direction of the magnetic field generated at this time is the magnetization inversion direction itself, and it means that the first and second write lines are driven to induce the magnetic fields in the direction corresponding to information. By making the magnitudes of the magnetic fields generated in the first and second write lines equal to each other, in the case where the directions are aligned in the parallel portion and the magnetic fields enhance each other, writing is enabled. In the case where the directions are opposite to each other and the magnetic fields cancel each other out, writing is disenabled. By using the phenomenon, driving control of selecting a cell to be written is performed.

Preferably, the magnetoresistive device in the magnetic memory device further comprises a stacked body including the magneto-sensitive layer, and a toroidal magnetic layer is provided on one of the faces of the stacked body. The toroidal magnetic layer uses a direction along the stacked face as an axial direction, and the parallel portion of the first and second write lines penetrates the toroidal magnetic layer along the axial direction. The expression "toroidal" in the "toroidal magnetic layer" shows a state where, when seen at least from the write lines penetrating the toroidal magnetic layer, the magnetic layer completely surrounds the write lines so as to be continuous magnetically and electrically, and the section in the direction crossing the write lines is closed. Therefore, the toroidal magnetic layer may contain an insulator as long as it is continuous magnetically and electrically, and may include an oxide film that is generated in a manufacturing process. The "axial direction" denotes an opening direction when attention is paid to the toroidal magnetic layer single body, that is, the direction of extension of the write line penetrating the layer. Further, the expression "an toroidal magnetic layer is provided on one of the faces of the stacked body" includes not only the case where the toroidal magnetic layer is disposed as a member separate from the stacked body on the side of one of faces of the stacked body but also the case where the toroidal magnetic layer is disposed so as to include part of the stacked body. In such a magnetoresistive device, when current flows in the write line, a closed magnetic circuit is formed in the toroidal magnetic layer. Thus, magnetization inversion of the magneto-sensitive layer is performed efficiently.

In a method of writing a magnetic memory device of the invention, first and second write lines are provided separately from a read line, and write current can be passed in two ways. At least one of the first and second write lines is formed in a loop shape including first and second portions connecting a bent portion and both ends. A parallel portion in which the first and second write lines extend parallel with each other is formed by bending at least one of the first and second write lines and making the first and second write lines cross each other. The magnetoresistive device is disposed in the parallel portion. Write current is supplied to the first and second write lines so that both of the write currents flowing in the first and second write lines in the parallel portion are in one of first and second directions corresponding to write information. By changing the magnetization direction of the magneto-sensitive layer by a magnetic field generated by the write currents, information is written.

In the method of writing a magnetic memory device according to the invention, first, by providing the first and second write lines separately from the read line, current is passed in two ways. Further, a parallel portion in which the write lines extend parallel with each other has to be formed by forming at least one of the write lines in a loop shape and bending at least one of the write lines. To the magnetoresistive device disposed in the parallel portion, write current is supplied in the direction according to information to be written as one of the two ways to both of the first and second write lines. The magnetization direction of the magneto-sensitive layer is changed by the magnetic field induced to the write current, and information is written.

To be more concrete, preferably, two magnetoresistive devices are disposed in a pair of the parallel portions, write current is supplied to the first and second write lines so that the directions coincide in each of the pair of parallel portions and the directions in the pair of parallel portions are opposite to each other, thereby changing the magnetization directions of magneto-sensitive layers of the two magnetoresistive devices so as to be anti-parallel with each other, and information is written by using the two magnetoresistive device as one memory cell. The expression "the magnetization directions are anti-parallel with each other" includes not only the case where the angle between the magnetization directions, that is, the directions of average magnetization in the magnetic layers is strictly 180° but also the case where the angle formed between the magnetization directions is deviated from 180° only by a predetermined angle due to an error occurring in manufacture, an error which occurs because a uniaxial state is not completely obtained, or the like. In correspondence with binary information, a memory cell is controlled in one of two states; a state where the magnetization directions of the magneto-sensitive layers of the pair of magnetoresistive devices are parallel with each other, and a state where the magnetization directions are anti-parallel with each other.

More preferably, both of the first and second write lines are formed in a loop shape, the first and second portions of one of the first and second write lines are bent in a rectangular wave shape or a trapezoid wave shape so that their bending directions coincide with each other, four parallel portions are provided in a pair of first and second write lines, a pair of magnetoresistive devices are disposed in two parallel portions provided in the first portion, thereby constructing a memory cell belonging to a first group. A pair of magnetoresistive devices is disposed in two parallel portions provided in the second portion, thereby constructing a memory cell belonging to a second group. Write current is supplied to the pair of first and second write lines so that current flows in the same direction in the first and second write lines in both of the two parallel portions and, moreover, current flows in opposite directions in the two parallel portions in a memory cell to be written as one of two memory cells belonging to the first and second groups. Write current is supplied to the first and second write lines so as to flow in opposite directions in both of the two parallel portions in the other cells, thereby changing a magnetization direction of each of the magneto-sensitive layers only in the pair of magnetoresistive devices in one of the memory cells, and selectively writing information.

At this time, by bending the first and second portions of one of the first and second write lines in a rectangular wave shape or a trapezoid wave shape so that their bending directions coincide with each other, the current directions of the first and second write lines are aligned in only one of the parallel portion provided in the first portion and the parallel portion provided in the second portion. That is, when the current directions of the first and second write lines are aligned in both of the two parallel portion in a memory cell to be written, in a memory cell which is not an object to be written, the current directions of the first and second write liens are opposite to each other in both of the two parallel portions. Therefore, a memory cell in the first group and a memory cell in the second group are not simultaneously selected. Information is selectively written to one of the memory cells. To a memory cell to be written, the write current is supplied in direction opposite to each other in the two parallel portions, and the magnetization directions of the magneto-sensitive layers in the pair of magnetoresistive devices are changed so as to be anti-parallel with each other.

In such a manner, preferably, the write current is supplied to a write line formed in a loop shape as one of the first and second write lines while controlling the direction of write current by selecting one of both ends as a write current inflow side and selecting the other end as an outflow side, and controlling so that the write current flows on the write lines with a predetermined current value. Consequently, the write current is supplied to the write lines while its magnitude and direction on the write line are controlled.

It is preferable to write information by applying magnetic fields in the same direction to the magneto-sensitive layers. That is, the directions of application magnetic fields are aligned in a single direction in accordance with information to be written. In this case, the sum of induced magnetic fields of the first and second write lines can be regarded as a single magnetic field in the magneto-sensitive layer, and the magnetization of the magneto-sensitive layer is inverted, so to speak, forcedly, to the direction of the magnetic field.

Further, when magnitudes of the magnetic fields applied to the magneto-sensitive layer are equalized, in the case where the magnetic fields are aligned in a single direction and enhance each other, writing is enabled. In the case where the magnetic fields are in opposite directions and cancel each other out, writing is disabled.

BEST MODE FOR CARRYING OUT THE INVENTION

Figure 1:
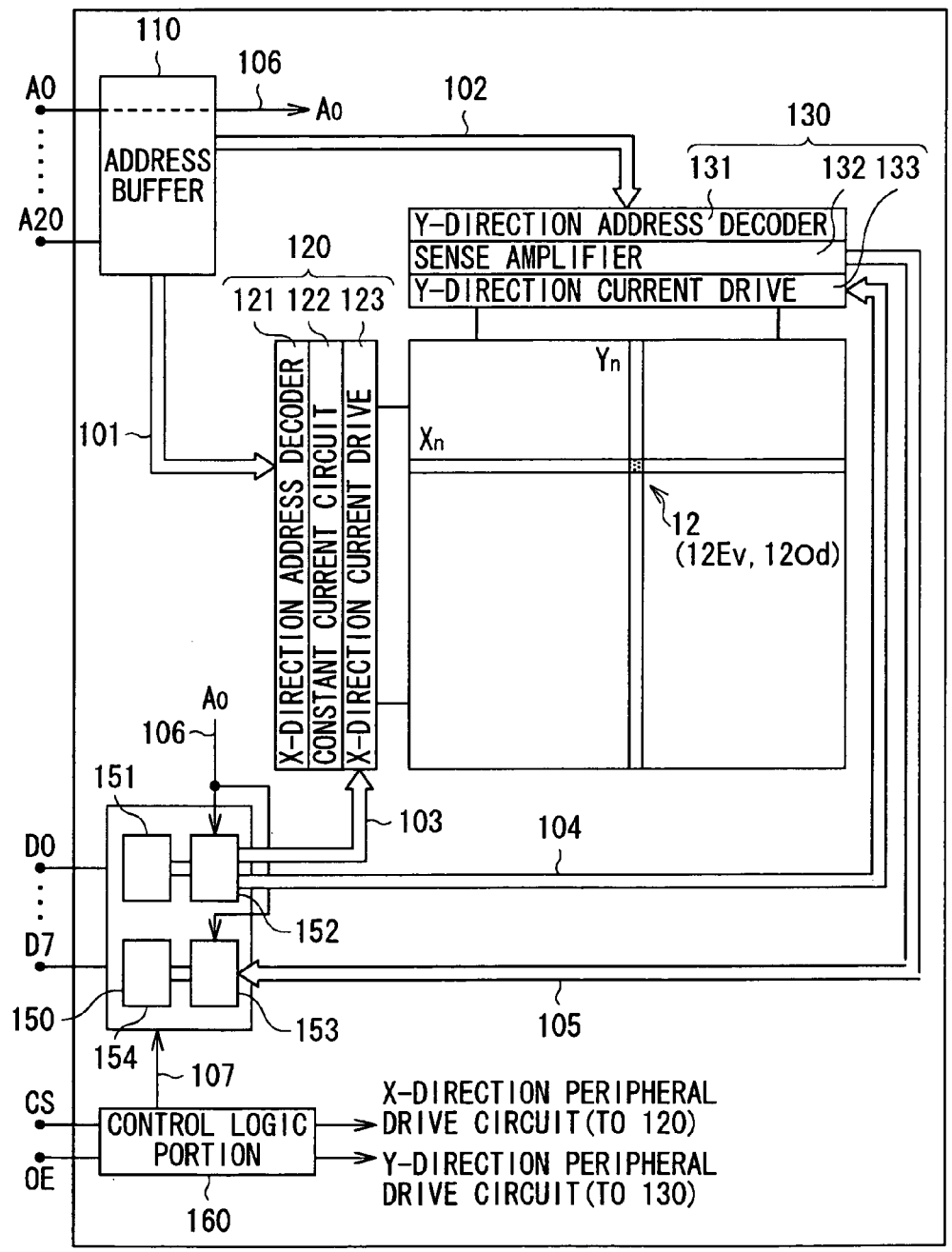
FIG. 1 is a block diagram showing a whole configuration of a magnetic memory device according to a first embodiment of the invention.

Embodiments of the invention will now be described in detail hereinbelow by referring to the drawings.

First Embodiment

FIG. 1 is a diagram showing a whole configuration of a magnetic memory device according to a first embodiment of the invention. The magnetic memory device is an MRAM embodied as a so-called semiconductor memory chip and has, as main components, an address buffer 110, an x-direction peripheral drive circuit 120, a Y-direction peripheral drive circuit 130, a memory cell group 140, a data buffer 150, and a control logic portion 160. The X-direction peripheral drive circuit 120 is constructed by an X-direction address decoder 121, a constant current circuit 122 for reading, and an X-direction current drive 123 for writing. The Y-direction peripheral drive circuit 130 is constructed by a Y-direction address decoder 131, a sense amplifier 132 for reading, and a Y-direction current drive 133 for writing.

Figure 2:
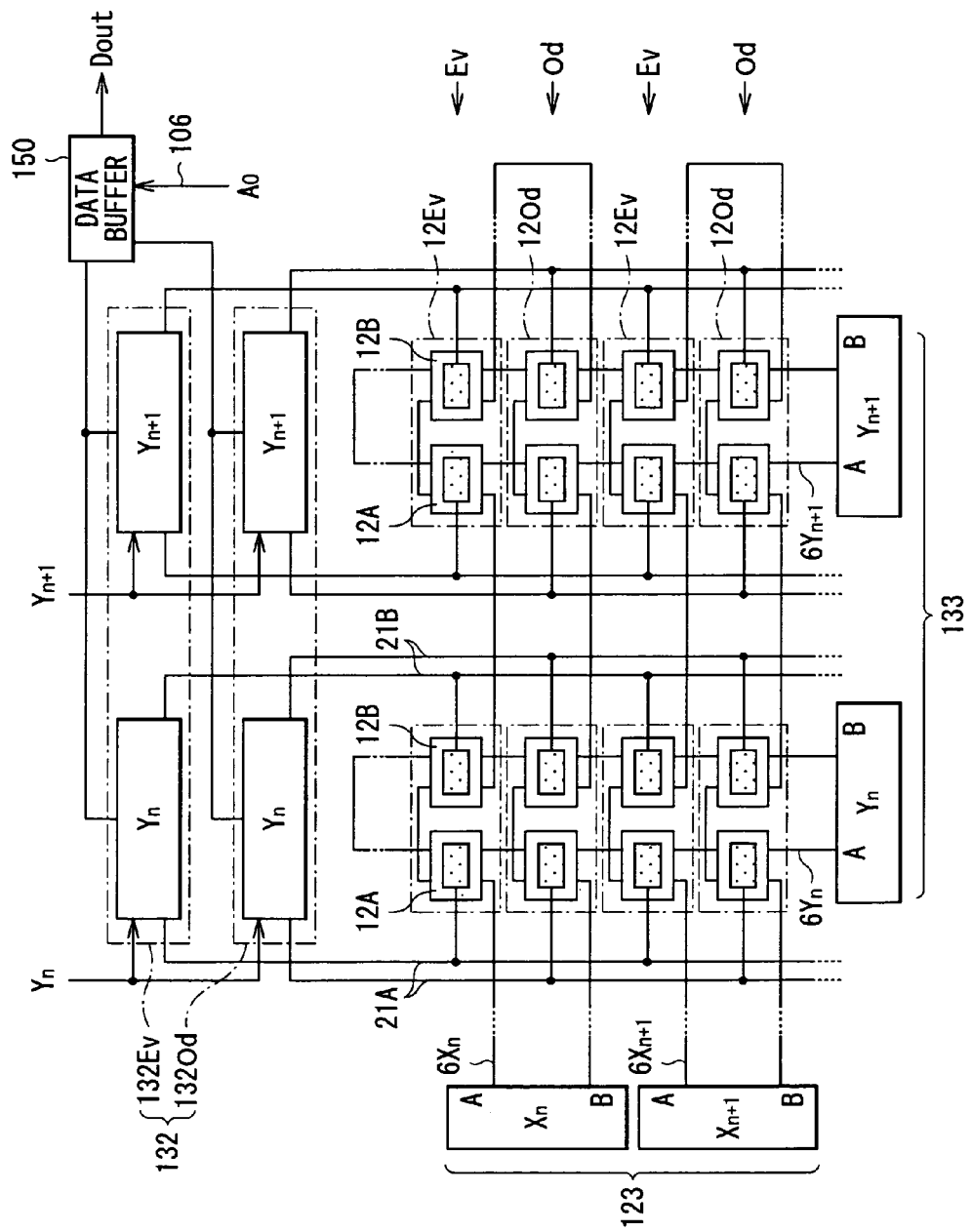
FIG. 2 is a block diagram showing the configuration of a main part of the magnetic memory device illustrated in FIG. 1.

FIG. 2 is a block diagram showing the configuration of a memory cell group, and a write circuit system and a read circuit system in the periphery. The memory cell group 140 is constructed by arranging a number of memory cells 12 in a word line direction (X direction) and a bit line direction (Y direction) in a matrix. In the following, each of the columns in the memory cells 12 in the memory cell group 140 will be called a word line, and each of the rows will be called a bit line.

First, the write circuit system will be described. Each of a write word line 6X and a write bit line 6Y (hereinbelow, write lines 6X and 6Y) has a loop shape. The write line 6X is bent each time it crosses the write line 6Y to form a rectangular wave shape, thereby forming a parallel portion in which the write lines 6X and 6Y are parallel with each other. Specifically, four parallel portions are formed from a pair of write lines 6X and 6Y, and magnetoresistive devices (12A and 12B) are disposed in each of the parallel portions. Further, one memory cell 12 is constructed by a pair of magnetoresistive devices 12A and 12B neighboring in the word line direction, and is disposed at each of upper and lower stages of the folded write line 6X ( . . . , 6Xn, 6Xn+1, . . . ).

Both ends of each write line 6X are connected to the corresponding X-direction current drive 123, and both ends of each write line 6Y are connected to the corresponding Y-direction current drive 133. That is, the write line 6X ( . . . , 6Xn, 6Xn+1, . . . ) and the X-direction current drive 123 correspond to each other in a one-to-one manner, and correspond to two upper and lower stages of the memory cells 12 of the write line 6X. On the other hand, the write line 6Y ( . . . , 6Yn, 6Yn+1, . . . ) and the Y-direction current drive 133 also correspond to each other in a one-to-one manner, and correspond to bit lines of the memory cells 12.

In the embodiment, the memory cell 12 on the upper stage side in the write line 6X is called a memory cell 12Ev of an even-numbered address, and the memory cell 12 on the lower stage side is called a memory cell 12Od of an odd-numbered address. A drive control is performed on each of a memory cell group Ev of even-numbered addresses and a memory cell group Od of odd-numbered addresses. The drive control is performed by selecting the pair of memory cells 12Ev and 12Od disposed at the upper and lower stages of the write line 6X of the same bit line, and determining either the memory cell group Ev or Od to which the memory cell 12 to be operated belongs.

The write lines 6X and 6Y are disposed separately from the read lines. The read lines in FIG. 2 are the sense bit decode lines 21A and 21B (hereinbelow, sense bit lines 21A and 21B) disposed for bit columns. The magnetoresistive devices 12A are connected to the sense bit lines 21A and the magnetoresistive devices 12B are connected to the sense bit lines 21B via read sensing conductors 11 which will be described later. The difference between sensing currents flowing in both of the lines is amplified by the sense amplifier 132.

The read circuit system is divided by the memory cell groups 12Ev and 12Od, and two systems are provided. Two sense bit lines 21A and two sense bit lines 21B are provided in correspondence with the memory cell groups 12Ev and 12Od, and are connected to sense amplifiers 132Ev and 132Od, respectively. The sense amplifiers 132Ev and 132Od corresponding to the same bit columns are selected by the same bit decode value ( . . . , Yn, Yn+1, . . . ). The group of sense amplifiers 132Ev and the group of sense amplifiers 132Od are separately cascaded and are connected to a read multiplexer 153 and an output buffer 154. One of an output of the sense amplifier 132Ev and an output of the sense amplifier 132Od is selected on the basis of an address signal $A_0$ of the least significant bit input from a group selection signal line 106 in the read multiplexer 153. The selected sense amplifier output is output as a read data signal (Dout) from the output buffer 154.

The other components of the magnetic memory device are constructed as follows to drive the memory cell group 140 and the peripheral circuits.

The address buffer 110 has external address input terminals A0 to A20 and is connected to the X-direction address decoder 121 and the Y-direction address decoder 131 via address lines 101 and 102, respectively. The address buffer 110 has the functions of receiving an address signal for selecting the memory cell 12 from the external address input terminals A0 to A20 and amplifying the address signal to a voltage level required in the address decoders 121 and 131 by an internal buffer amplifier. The address buffer 110 also separates the amplified selection signal into two selection signals in the word line direction (X direction) and the bit line direction (Y direction) of the memory cell 12 and supplies the selection signals to the address decoders 121 and 131.

The address of the least significant bit input from the external address input terminal A0 is regarded as information indicating that the memory cell 12 to be selected belongs to the memory cell group Ev of an even-numbered address or the memory cell group Od of an odd-numbered address. The signal voltage is set as an address selection signal $A_0$. Only the address selection signal $A_0$ is transmitted to the data buffer 150 via the group selection signal line 106. In the case where the magnetic memory device has plural memory cell groups 140, an address signal for selecting one memory cell group 140 from the plural memory cell groups 140 is also input to the address buffer 110.

The data buffer 150 has external data terminals D0 to D7 for transmitting/receiving digital data signals to/from the outside, and is connected to the control logic portion 160 via a control signal line 107. The data buffer 150 has, as an input system, an input buffer 151 and a write logic controller 152 and has, as an output system, the read multiplexer 153 and the output buffer 154. Each of the input buffer 151 and the output buffer 154 operates according to a control signal from the control logic portion 160.

The input buffer 151 receives a data signal from the external data terminals D0 to D7 at the time of writing data to the memory, amplifies the data signal to a voltage level required by an internal buffer amplifier, and inputs the amplified data signal to the write logic controller 152.

The write logic controller 152 receives the data signal from the input buffer 151 and the address section signal $A_0$ from the group selection signal line 106 and, on the basis of the signals, controls the operation of the current drive 123 or 133 selected by a high-order bit address. Specifically, data signals XDin and YDin and reference signals XRef and YRef are transmitted to the X-direction current drive 123 and the Y-direction current drive 133 via write data buses 103 and 104, respectively, so that the current drives 123 and 133 pass current to the write lines 6X and 6Y in the direction according to (1) the destination which is one of the pair of the memory cells 12Ev and 12Od and (2) "1" or "0" to be written.

The read multiplexer 153 is connected to the read data bus 105 and the group selection signal line 106 via which an output of the sense amplifier 132 and the address selection signal $A_0$ is input. From the sense amplifier 132, two pieces of data corresponding to both of the memory cell groups 12EV and 12Od are input. An output of the memory cell 12 to be read is selected by using the address selection signal $A_0$ and is input to the output buffer 154. The output buffer 154 has an internal buffer amplifier and has the function of outputting a read data signal that is input at the time of reading data from the memory to the external data terminals D0 to D7 at low impedance.

The control logic portion 160 has input terminals CS and WE and is connected to the data buffer 150 via the control signal line 107. The control logic portion 160 performs operation control on the memory cell group 140. From the input terminal CS, a (chip select; CS) signal indicating whether an operation of writing/reading the magnetic memory device is made active or not is input. From the input terminal WE, a write enable (WE) signal for switching the writing/reading operation is input. The control logic portion 160 has the function of amplifying a signal voltage received via the input terminal CS and WE to a voltage level necessary in the peripheral drive circuits 120 and 130 by the internal buffer amplifier and transmits the amplified signal to the peripheral drive circuits 120 and 130.

Configuration of Memory Cell

Figure 3:
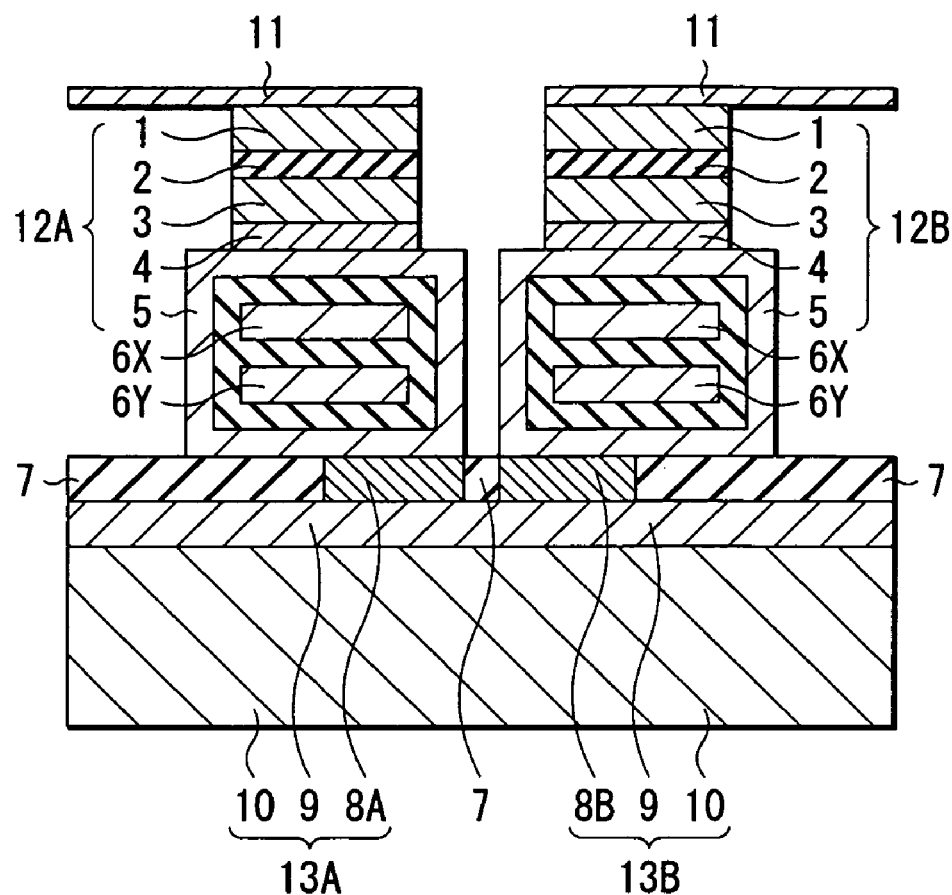
FIG. 3 is a cross section showing a concrete configuration of the memory cell illustrated in FIG. 1.

FIG. 3 is a cross section showing the configuration of the memory cell according to the embodiment. The magnetoresistive devices 12A and 12B of each memory cell 12 are magnetoresistive devices using the GMR or TMR effect. As a concrete example, the case where the magnetoresistive devices 12A and 12B are TMR devices will be described.

The memory cell 12 is constructed by the pair of right and left magnetoresistive devices 12B and 12A formed on a surface of a substrate 10. Each of the magnetoresistive devices 12A and 12B has a configuration including a stacked body in which a first magnetic layer 1, a nonmagnetic layer 2, and a second magnetic layer 3 are stacked, and an toroidal magnetic layer 5 disposed by using a direction along a stacked surface as the axial direction on one of face sides of the stacked body and constructed so as to be penetrated by write lines 6X and 6Y in the axial direction. The second magnetic layer 3 and the toroidal magnetic layer 5 are bonded to each other over a nonmagnetic conductive layer 4 and are electrically connected to each other. Each of the magnetoresistive devices 12A and 12B is provided with the read sensing conductor 11 on the top face (face on the side opposite to the toroidal magnetic layer 5) of the stacked body, so that current can be passed perpendicular to the stack surface of the stacked body toward the substrate 10.

The first magnetic layer 1 is a ferromagnetic layer whose magnetization direction is pinned, and the second magnetic layer 3 is a ferromagnetic layer (magneto-sensitive layer) whose magnetization direction changes according to an external magnetic field. The magnetic layers are stacked while sandwiching the nonmagnetic layer 2 which is very thin as a few nm (tens Å). In the stacked body, when a voltage in the perpendicular direction is applied to the stack surface between the first and second magnetic layers 1 and 3, for example, electrons in the second magnetic layer 3 penetrate the nonmagnetic layer 2 and move in the first magnetic layer 1, so that tunnel current flows. That is, the nonmagnetic layer 2 is a tunnel barrier layer in this case. The tunnel current changes according to relative angles between spins in the first magnetic layer 1 and spins in the second magnetic layer 3 in the interface portion with the nonmagnetic layer 2. When the spin in the first magnetic layer 1 and that in the second magnetic layer 3 are parallel with each other, the resistance value of the magnetoresistive device 12A (12B) becomes the minimum. When they are anti-parallel with each other, the resistance value becomes the maximum.

The thickness of the nonmagnetic layer 2 is determined on the basis of tunnel resistance and the like. Generally, in the magnetic memory device using the TMR device, for matching with a semiconductor device such as a transistor, proper tunnel resistance is tens $k\Omega \cdot (\mu m)^2$. To realize higher packing density and higher operation speed in the magnetic memory device, the tunnel resistance is set to, preferably, 10 $k\Omega \cdot (\mu m)^2$ or less, more preferably, 1 $k\Omega \cdot (\mu m)^2$ or less. To realize such a tunnel resistance value, the thickness of the nonmagnetic layer 2 is preferably set to 2 nm or less, more preferably, 1.5 nm or less. When the nonmagnetic layer 2 is too thin, although the tunnel resistance can be reduced, a leak current may occur due to roughness of the junction interface between the first and second magnetic layers 1 and 3, and the MR ratio deteriorates. To prevent this situation, the nonmagnetic layer 2 has to have a thickness with which leak current does not flow. Concretely, the thickness of the nonmagnetic layer 2 is desirably 0.3 nm or more.

The magnetization direction of the second magnetic layer 3 changes according to an induction field that is generated when write current is passed to the write lines 6X and 6Y and its angle relative to the magnetization of the first magnetic layer 1 is inserted. The magnetization of the second magnetic layer 3 is inverted by using the magnetic field generated in the parallel portion of the write lines 6X and 6Y, and these magnetic fields are directed in the same direction with respect to the second magnetic layer 3. That is, the magnetic fields generated are applied in a single direction, that is, a change direction of the magnetization of the second magnetic layer 3, and act so as to directly determine the direction of magnetization. The magnetoresistive device 12A (12B) is preferably disposed in an area in which the magnetic field is generated only in the direction orthogonal to the parallel portion in the parallel portion of the write lines 6X and 6Y. The magnetization inversion can be realized by considering, for example, the dimension ratio between the length of the parallel portion of the write lines 6X and 6Y and the length of the magnetoresistive device 12A (12B), placement on the parallel portion of the magnetoresistive device 12A (12B), and the like.

In such a manner, the magnetization direction of the second magnetic layer 3 is controlled with reliability. Since the magnitude of the applied magnetic field is larger than combined transverse magnetic fields induced to orthogonal lines, and the magnetic fields invert the direction to the opposite direction. Consequently, in the second magnetic layer 3, the magnetization inversion efficiency is high and the tunnel resistance change rate higher than that in the conventional technique can be obtained. Thus, the writing operation can be performed efficiently.

As described above, the magnetization direction of the second magnetic layer 3 is forcedly controlled to the direction of the magnetic field applied in the parallel portion. Thus, the magnetic property can be determined according to the relative relation with the magnitude of the applied magnetic field and the like. For example, when the strength of the applied magnetic field is sufficiently high, magnetic anisotropy in the second magnetic layer 3 does not have to be considered. In this case, the invention is not limited to the single magnetic domain structure but may have a bulk structure. In the conventional technique, writing operation is performed by using the induced magnetic fields having orthogonal components. Consequently, the magneto-sensitive layer ideally has uniaxial magnetic anisotropy and has to have a single magnetic domain. However, it is not easy to form a magneto-sensitive layer having a single magnetic domain from a thin magnetic layer. Further, in order to control magnetic anisotropy of the magneto-sensitive layer, a process such as magnetic field heat treatment in which magnetic field conditions are precisely controlled is necessary. In contrast, there is no regulation in the magnetic property of the second magnetic layer 3 of the embodiment for the above-described reason, formation is very easy.

Since the memory cell 12 to be written is selected on the basis of the so-called matrix driving method, the magnetic characteristic, dimensions, and the like of the second magnetic layer 3 are set so that the magnetization can be inverted only when current is passed in the same direction to both of the write lines 6X and 6Y, not to one of the write lines 6X and 6Y. In the case of giving magnetic anisotropy to the second magnetic layer 3, to stabilize the magnetization in a state where the magnetization is parallel/anti-parallel with the magnetization of the first magnetic layer 1, it is preferable to set the axis of easy magnetization of the second magnetic layer 3 to be parallel with the magnetization pinned direction (the direction of the axis of easy magnetization) of the first magnetic layer 1. Although the write lines 6X and 6Y are aligned in the vertical direction in this case, for example, they may be aligned in parallel in the horizontal direction.

In the case of passing currents in the opposite directions to the write lines 6X and 6Y, setting is made so that the induced magnetic fields are cancelled off each other and a magnetic field necessary for writing is not generated. Concretely, write currents of the same magnitude are passed to the write lines 6X and 6Y, and setting is made so that the magnitudes of the induced magnetic fields are equal to each other in the second magnetic layer 3.

The toroidal magnetic layer 5 has a cylindrical shape having the axis perpendicular to the drawing sheet of FIG. 3 and includes a part in which the write lines 6X and 6Y are parallel with each other. The toroidal magnetic layer 5 is made of a magnetic material having high magnetic permeability, and its sectional shape is a closed loop as shown in the diagram. Consequently, the magnetic fields induced to the currents flowing in the write lines 6X and 6Y re-circulates in the layer along a surface parallel with the section of the toroidal magnetic layer 5. As described above, the toroidal magnetic layer 5 has the function of confining the magnetic flux of the induced magnetic field in the layer and efficiently inverting the magnetization of the second magnetic layer 3. Simultaneously, it has the electromagnetic shielding effect which prevents a magnetic flux from being leaked to the outside. Since the toroidal magnetic layer 5 is constructed so as to be in contact with one surface of the second magnetic layer 3, the magnetic field can be easily transmitted to the second magnetic layer 3, and the magnetic field can be applied to the second magnetic layer 3 positioned in proximity with high magnetic flux density.

In each of the magnetoresistive devices 12A and 12B, read current flows from the read sensing conductor 11 to the stacked body and passes from the toroidal magnetic layer 5 to the substrate 10. Therefore, conductive materials are used for all of the layers in the stacked body except for the nonmagnetic layer 2 to which tunnel current is passed, the nonmagnetic conductive layer 4 and the toroidal magnetic layer 5. For the first and second magnetic layers 1 and 3, for example, a cobalt iron alloy (CoFe) is used. Other than the cobalt iron alloy, a single cobalt (Co), a cobalt platinum alloy (CoPt), a nickel iron cobalt alloy (NiFeCo), or the like can be used. The nonmagnetic conductive layer 4 functions to antiferromagnetic-couple the second magnetic layer 3 and the toroidal magnetic layer 5. For example, ruthenium (Ru), copper (Cu), or the like is used. For the toroidal magnetic layer 5, iron (Fe), nickel iron alloy (NiFe), Co, CoFe, NiFeCo, or the like can be used. To make the magnetic fields generated by the write lines 6X and 6Y concentrated in the toroidal magnetic layer 5, it is preferable to use a material having permeability as high as possible (concretely, the permeability is 2,000 or higher, more preferably, 6,000 or higher). The write lines 6X and 6Y are made of aluminum (Al), copper (Cu), or an alloy of aluminum or copper and are electrically insulated from each other via an insulating film. The write lines 6X and 6Y may be made of tungsten (W) and one of the above-described materials or may have another structure in which titanium (Ti), titanium nitride (TiN), and aluminum (Al) are sequentially stacked.

As will be described in detail later, one of the magnetoresistive devices 12A and 12B in the memory cell 12 is set to a low resistance state, and the other is set to a high resistance state to store information. This is for amplifying the difference between outputs from the two magnetoresistive devices 12A and 12B and reading the resultant. The magnetoresistive devices 12A and 12B paired have to be manufactured so as to have the same resistance value, the same magnetic resistance change rate, and the same magnitude of the inversion magnetic field of the second magnetic layer 3.

On the substrate 10 over which the magnetoresistive devices 12A and 12B are to be formed, an epitaxial layer 9 is formed. On the epitaxial layer 9, a conductive layer 8 and an insulating layer 7 are formed. The conductive layer 8 is constructed by conductive layers 8A and 8B insulated from each other via the insulating layer 7. The magnetoresistive devices 12A and 12B are formed on the top face of the conductive layer 8 and the insulating layer 7 and positioned so that at least part of the formation areas of the magnetoresistive devices 12A and 12B overlap with the formation areas of the conductive layers 8A and 8B. Therefore, the magnetoresistive devices 12A and 12B are joined to the conductive layers 8A and 8B insulated from each other, respectively, and are electrically insulated from each other. That is, wiring is conducted so that the magnetoresistive devices 12A and 12B are electrically non-conductive.

The substrate 10 takes the form of an n-type silicon wafer. Generally, the n-type silicon wafer is doped with impurity of P (phosphorus). As the substrate 10, a substrate of the $n^{++}$ type obtained by high-concentration doping of P (phosphorus) is used. On the other hand, as the epitaxial layer 9, a substrate of the $n^-$ type obtained by low-concentration doping of P (phosphorus) is used. The conductive layer 8 is made of a metal. When the epitaxial layer 9 as an $n^-$ type semiconductor and the metal conductive layer 8 come into contact with each other, a band gap occurs and a Schottky diode is formed. This is how backflow prevention diodes 13A and 13B in the embodiment are formed.

The diodes 13A and 13B are provided to prevent backflow of read current from the substrate 10 side via the magnetoresistive devices 12A and 12B. The magnetoresistive device 12A and the backflow prevention diode 13A are insulated from the magnetoresistive device 12B and the backflow prevention diode 13B.

The configuration and operation of a write circuit system in the magnetic memory device will now be described.

Configuration of Write Circuit System

Figure 4:
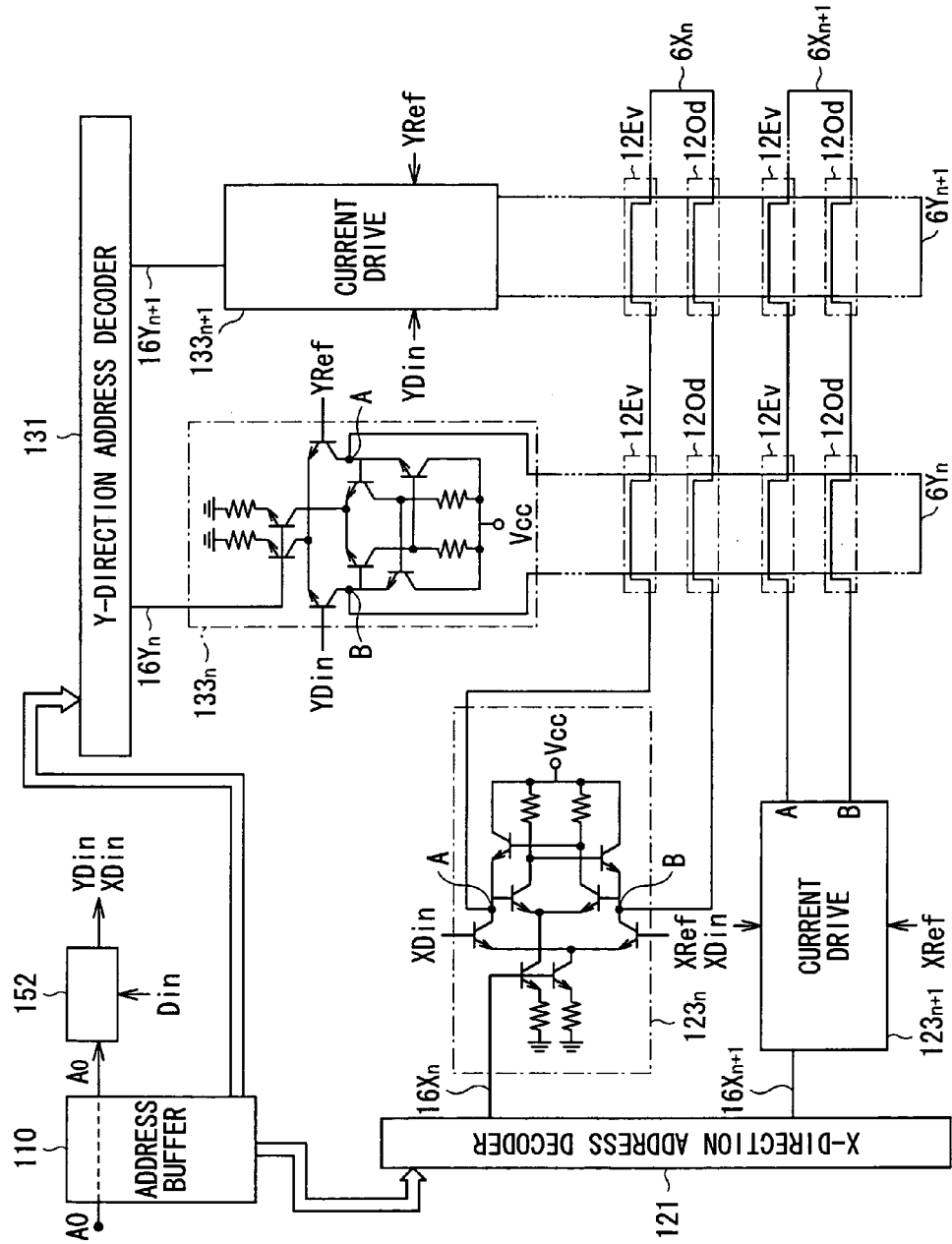
FIG. 4 is a configuration diagram showing a write circuit system of the magnetic memory device illustrated in FIG. 1.

FIG. 4 shows the configuration of the write circuit system of the magnetic memory device. Due to the limited space, the memory cell group 140 and the current drives 123 and 133 cannot be drawn. Consequently, the (n)th and (n+1)th configuration units are representatively shown. The X-direction address decoder 121 is connected to the current drive 123 ( . . . 123n, 123n+1, . . . ) via a write word decode line 16X ( . . . 16Xn, 16Xn+1, . . . ). The Y-direction address decoder 131 is connected to the current drive 133 ( . . . 133n, 133n+1, . . . ) via a write bit decode line 16Y ( . . . 16Yn, 16Yn+1, . . . ). The X-direction address decoder 121 and the Y-direction address decoder 131 transmit selection signals corresponding to address high-order bits input from the address buffer 110 to the write word decode line 16X and the write bit decode line 16Y, respectively. By the selection signals, one of the current drives 123 is selected and becomes operable, and one of the current drives 133 is also selected as an object to be driven.

The X-direction current drive 123 and the Y-direction current drive 133 are constant current source circuits for supplying current of a predetermined magnitude to the write lines 6X and 6Y, respectively, at the time of writing data to the memory cell 12. One end of the write line 6X is connected to a drive point A in the current drive 123, and the other end is connected to a drive point B. One end of the write line 6Y is connected to a drive point A in the current drive 133, and the other end is connected to a drive point B. Current can be supplied in both directions from the drive point A to the drive point B and from the drive point B to the drive point A.

The current drives 123 and 133 are controlled to write, according to the directions of current supplied to the write lines 6X and 6Y, (1) "1" or "0" and (2) in which one of the memory cells 12Ev and 12Od as a pair. The direction of the write current is selected by the data signal XDin and the reference signal XRef in the current drive 123 and is selected by a data signal YDin and a reference signal YRef in the current drive 133. The data signals XDin and YDin are supplied from the write logic controller 152 to the current drives 123 and 133 as described above, and the reference signals XRef and YRed are inversion signals of the data signals XDin and YDin.

Figures 5, 6:
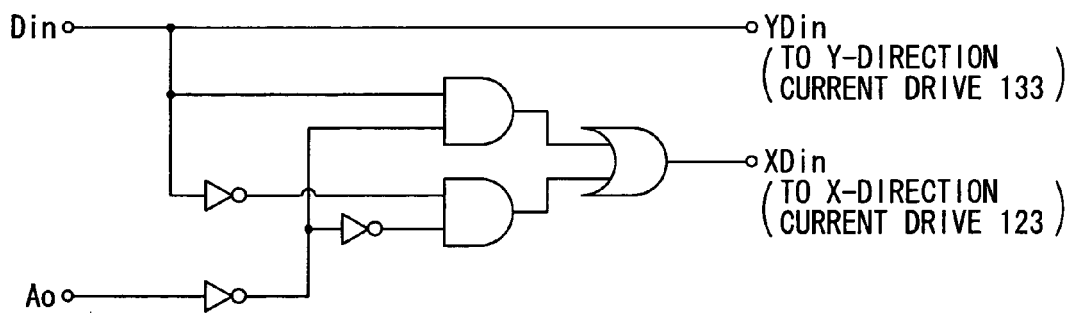
FIG. 5 is a table illustrating operations in a write logic controller illustrated in FIG. 1.
FIG. 6 is a diagram showing a circuit configuration of the write logic controller illustrated in FIG. 1.

FIG. 5 shows a correspondence table of logic controls performed by the write logic controller in this case, and FIG. 6 shows a concrete example of the write logic controller. There are four ways to "write data to the memory cells 12Ev and 12Od" as shown in the correspondence table, and one of the four ways is unconditionally determined by the address selection signal $A_0$ and the data signal Din. The data signals XDin and YDin in the case of passing current in the direction from the drive point A to the drive point B in the current drives 123 and 133 are set to "1", and the data signals XDin and YDin in the case of passing current in the direction from the drive point B to the drive point A are set to "0". The write logic controller 152 determines the data signals XDin and YDin so that four operation patterns of the supply current directions in the current drives 123 and 133 correspond to four ways of controls identified by the address selection signal $A_0$ and the data signal Din which are input.

Configuration of Current Drives

Figure 7:
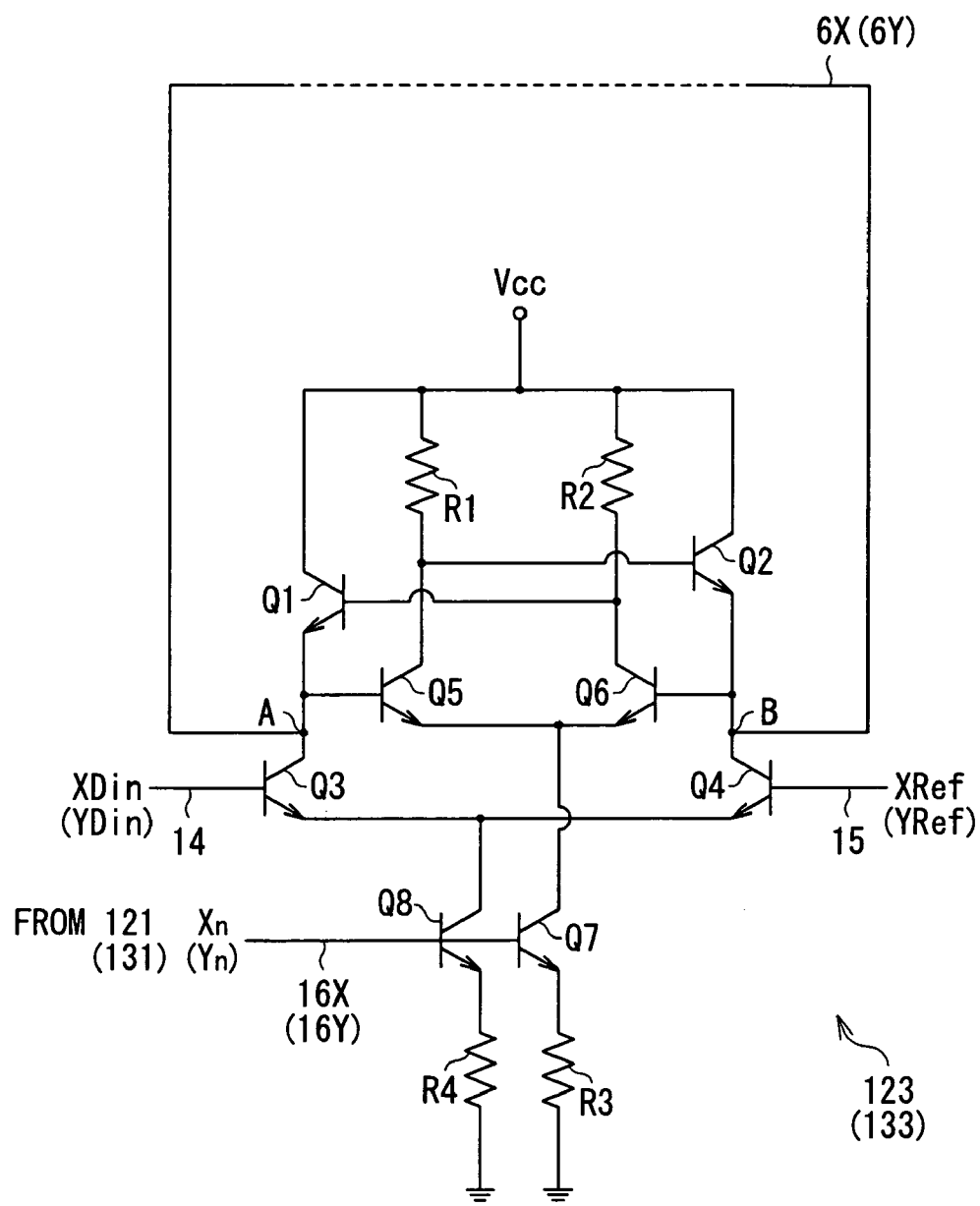
FIG. 7 is a circuit diagram of a current drive illustrated in FIG. 1.
Figure 8:
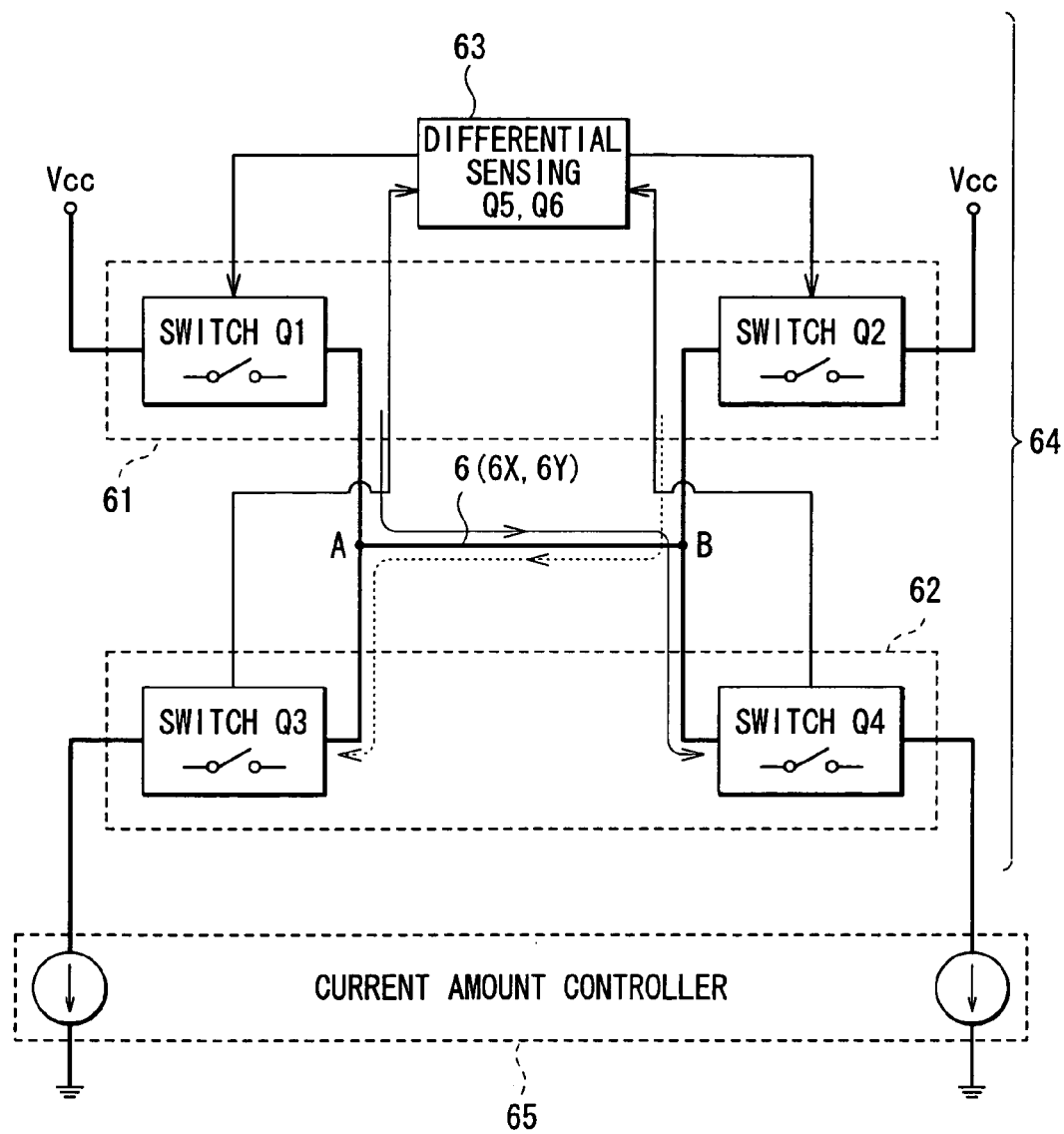
FIG. 8 is a conceptual configuration diagram showing an action configuration of the current drive illustrated in FIG. 7.
Figure 9:
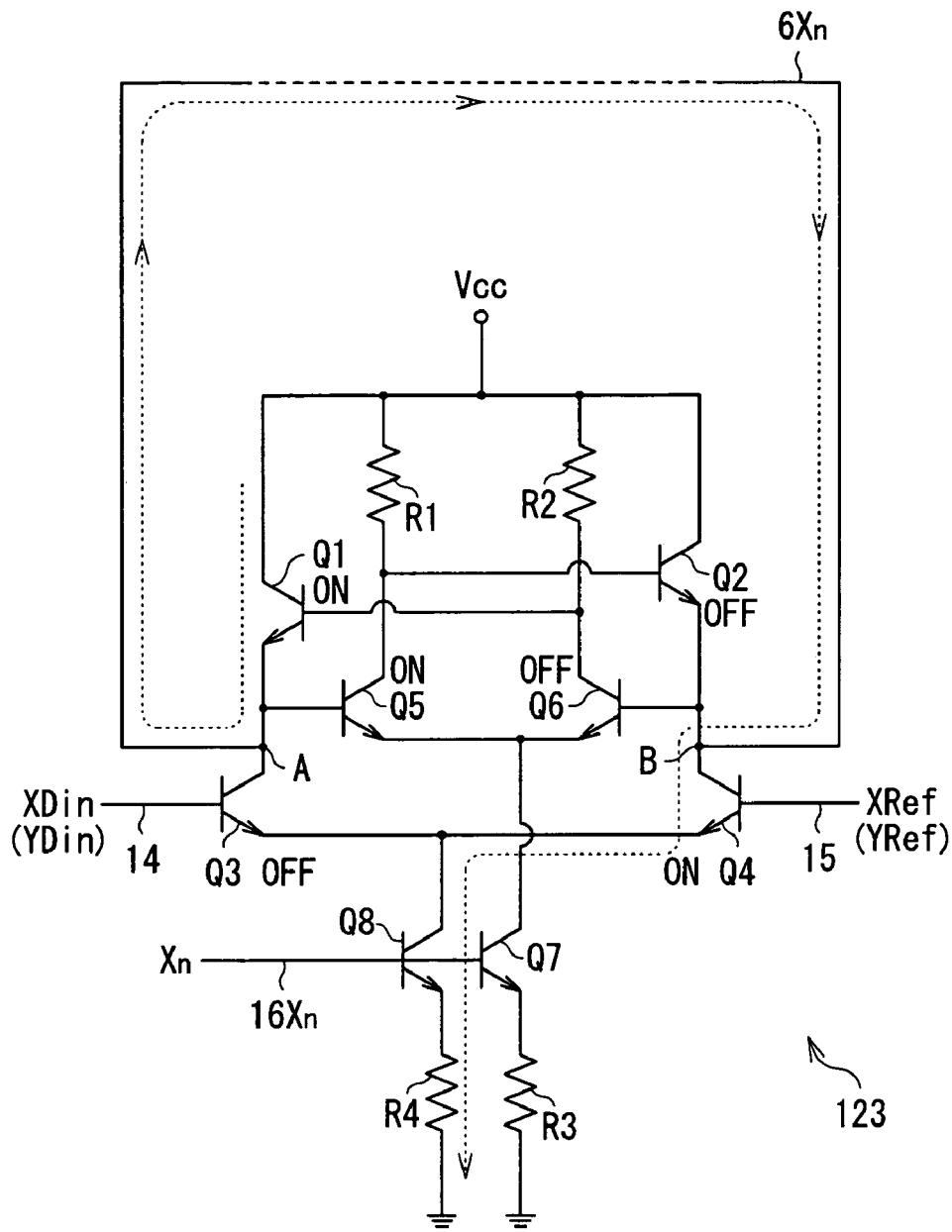
FIG. 9 is a diagram showing an operation state of each of transistors and a write current path when an X-direction current drive illustrated in FIG. 4 operates.

The action and configuration of the current drives 123 and 133 in the embodiment will now be described. FIG. 7 shows a concrete configuration of the current drive, and FIG. 8 shows a conceptual configuration focused on the functions.

The current drives 123 and 133 have both of (1) the function as a switch for controlling the direction of current passed to the write lines 6X and 6Y, and (2) the function of fixing the current amount to a predetermined value, and can supply stable constant current obtained by eliminating the influence of resistance variations in the write line 6. The (1) function of controlling the direction of current is realized by a current direction controller 64 shown in FIG. 8. The current direction controller 64 is constructed by three differential switch pairs; first and second differential switch pairs 61 and 62 and a differential controller 63 (third differential switch pair).

The first differential switch pair 61 is constructed by switches Q1 and Q2. The switches Q1 and Q2 are provided between the power source Vcc and terminals A and B of the write line 6. When one of the switches Q1 and Q2 is turned and the other is turned off, current from the power source Vcc is passed to one of the ends A and B. The second differential switch pair 62 is constructed by switches Q3 and Q4. The switches Q3 and Q4 are provided between the ends A and B of the write line 6 and the ground. When one of the switches Q3 and Q4 is turned on and the other is turned off, one of the ends A and B is led to the ground to let the current go.

Therefore, while the switches Q1 and Q4 are closed and the switches Q2 and Q3 are open, current flows in the write line 6 in the direction of the dotted line. While the switches Q1 and Q4 are open and the switches Q2 and Q3 are closed, current flows in the write line 6 in the direction of the solid line. Such complementary operations of the first and second differential switch pairs 61 and 62 are controlled by the differential controller 63. The differential controller 63 is constructed by, for example, switches Q5 and Q6, differentially senses the on/off state of the switches Q3 and Q4 and, on the basis of the result of sensing, controls the on/off state of the switches Q1 and Q2, thereby making the two differential switch pairs 61 and 62 operate in cooperation with each other.

The switches Q1 to Q6 correspond to the transistors Q1 to Q6 in the actual circuit of FIG. 7, respectively. To the base terminal of the transistor Q3, a data signal line 14 (Din) to which a data signal based on data to be written is input is connected. To the base terminal of the transistor Q4, a reference signal line 15 (Ref) to which a reference signal obtained by inverting the data signal is input is connected.

The (2) function of controlling the constant current in the write line is realized by a current amount controller 65 (refer to FIG. 8). The current amount controller 65 is provided on the ground side than the write line 6 and functions to fix the amount of current flowing out from the write line 6. Since the current amount is the current amount in the write line 6, current of a constant amount always flows in the write line 6 irrespective of the resistance value in the write line 6. In a conventional current drive, the current amount control has to be performed at an ante stage of supplying current to the write line, and the constant current control which is as perfect as the constant current control of the present invention has not been realized. In FIG. 8, the current amount controller 65 is constructed by two constant current sources provided between the switches Q3 and Q4 and the ground. The two constant current sources are an expression of an equivalent circuit or the like in order to give description along a current path. In reality, one constant current circuit commonly connected to the transistors Q3 and Q4 may be used.

In FIG. 7, the decode signal voltage input to the transistor Q8, the resistor R4 for current regulation, and the word decode line 16X (bit decode line 16Y) corresponds to the current amount controller 65. That is, it is designed so that the decode signal is set to a predetermined voltage at the ante stage of the current drive 123 (133).

The transistors Q7 and Q8 also function as semiconductor switches for decoding. To the base terminals of the transistors Q7 and Q8 of the current drive 123, the word decode lines 16X ( . . . , 16Xn, 16Xn+1, . . . ) are connected. To the base terminals of the transistors Q8 and Q7 of the current drive 133, the bit decode lines 16Y ( . . . , 16Yn, 16Yn+1, . . . ) are connected.

Operation of Current Drive

As a concrete example, the operation performed in the case where the current drive 123 selected by the word decode signal Xn supplies current to the write line 6Xn from the drive point A to the drive point B will be described. At this time, a data signal of the "low" level is input to the data signal line 14, and the reference signal of the "high" level is input to the reference signal line 15. Therefore, the transistor Q3 is turned off, and the transistor Q4 is turned on.

When the transistor Q4 is turned on, in the transistor Q6, the base voltage drops and becomes almost the same as the potential of the emitter terminal. Consequently, the transistor Q6 is turned off. Since the transistor Q3 is in the off state, in the transistor Q5, a high voltage relative to that at the emitter terminal is applied to the base terminal. Consequently, the transistor Q5 is turned on.

When the transistor Q5 is turned on, the base voltage of the transistor Q2 drops. Since the transistor Q6 is in the off state, the base voltage of the transistor Q1 becomes relatively high. As a result, the transistor Q1 enters the on state in which a larger amount of current flows, and the transistor Q2 enters the off state in which a smaller amount of current flows. That is, by the influence of the on/off operation on the transistors Q5 and Q6 exerted on the voltage level at the base terminal, the transistor Q1 operates to pass a large mount of current, and the transistor Q2 operates to pass a very small amount of current.

As a result of the series of operations of the transistors Q1 to Q6, current from the power source Vcc flows on the side of the transistor Q1 which is in the on state as one of the transistors Q1 and Q2 and flows into the drive point A. Since the transistor Q3 is in the off state, the current flows from the drive point A to the write line 6Xn, flows out from the drive point B, passes through the transistor Q4 in the on state, and flows into the ground side.

That is, in the first differential switch pair, when the transistor Q1 is turned on and the transistor Q2 is turned off, the drive point A is selected to the current inflow side of the write line 6Xn. On the other hand, in the second differential switch pair, when the transistor Q3 is turned off and the transistor Q4 is turned on, the drive point B on the other side is selected to the current outflow side of the write line 6Xn. In such a manner, the write current is supplied from the current drive 123 to the write line 6Xn in the direction from the drive point A to the drive point B.

The write current is led to the ground via the transistor Q8 and the resistor R4. The magnitude I of the write current flowing into the path of the transistor Q4 and the resistor R4 is given by Formula 1 when the resistance value of the resistor R4 is Rc.

$$I(A)=(Vb-\phi')(\text{Volt})/Rc(\Omega) \qquad \text{Formula 1}$$

where Vb denotes the voltage level input to the base terminal of the transistor Q8, and $\phi'$ denotes a forward voltage between the base and the emitter. Since the values are fixed values, it is understood that once the resistance value Rc is determined, the current passed becomes a fixed value, and the current value is unconditionally determined by using the resistance value Rc as a parameter. As described above, the value of the write current is fixed on the path where it flows from the write line 6Xn, so that the write current flows in the write current 6Xn always with a predetermined value.

On the other hand, to pass the current in the direction from the drive point B to the drive point A, it is sufficient to input the data signal of the "high" level to the data signal line 14 and to input the reference signal of the "low" level to the reference signal line 15. The first to third differential switch pairs (transistors Q1 to Q6) switch in the manner opposite to the above case, the write current flows from the transistor Q2 to the drive point B, flows out from the drive point A via the write line 6Xn, and flows in the transistor Q3.

Writing Operation

On the basis of the above, a driving method of the write circuit system in the magnetic memory device will be described.

First, the information storing method in the memory cell 12 will be described. In the memory cell 12, the magnetization directions of the first magnetic layers 1 in the pair of magnetoresistive devices 12A and 12B are fixed in the predetermined direction (to the right side in FIGS. 11 and 13) but the second magnetoresistive layers 3 are magnetized in anti-parallel with each other. Consequently, in the magnetoresistive devices 12A and 12B, the combination of the magnetization directions of the first and second magnetic layers 1 and 3 are always "anti-parallel, parallel" or "parallel, anti-parallel". Therefore, by making each of the states correspond to binary information "0" and "1". By setting the memory cell 12 to any of the states, information of one bit can be stored in one memory cell 12. When the magnetization directions of the first and second magnetic layers 1 and 3 are parallel with each other, the magnetoresistive device 12A (12B) enters a low resistance state in which a large tunnel current flows. When the magnetization directions are anti-parallel with each other, the magnetoresistive device 12A (12B) enters a high resistance state in which only a small tunnel current flows. That is, one of the magnetoresistive devices 12A and 12B in the pair enters a low resistance state, and the other enters a high resistance state, thereby storing information.

The storage states are written by making the magnetization directions of the second magnetic layers 3 of the magnetoresistive devices 12A and 12B anti-parallel with each other. To make the magnetization directions anti-parallel with each other, currents opposite to each other have to be passed to the magnetoresistive devices 12A and 12B.

A method of writing information based on the storing method will now be described. First, the address buffer 110 receives voltages of address signals input to the external data terminals A0 to A20 and amplifies them by the internal buffer. Signals of higher bits are transmitted to the address decoders 121 and 131 via the address lines 101 and 102, respectively (FIGS. 1 and 4). The address selection signal $A_0$ as the least significant bit of the address is transmitted to the write logic controller 152 via the group selection signal line 106. The data buffer 150 receives voltages of data signals input to the external data terminals D0 to D7, amplifies them by the input buffer 151, converts the amplified signals to the data signals XDin and YDin in the write logic controller 152 to which the address selection signal $A_0$ is input, and generates reference signals XRef and YRef as inversion signals of the data signals XDin and YDin.

At the time of writing, the address decoders 121 and 131 transmit selection signals of address upper bits which are input from the address buffer 110 to the current drives 123 and 133 via the write word decode lines 16X ( . . . 16Xn, 16Xn+1, . . . ) and the write bit decode lines 16Y ( . . . 16Yn, 16Yn+1, . . . ), respectively. In each of the current drives 123 and 133, the word decode value or the bit decode value becomes the "high" level, the transistors Q7 and Q8 are made conductive (FIGS. 4, 7, and the like), and the current drive is selected as an object to be driven.

From the write logic controller 152, the data signals XDin and YDin are input to the data signal lines 14 of the current drives 123 and 133, and the reference signals XRef and YRef are input to the reference signal lines 15, respectively. By the operation, in the current drives 123 and 133 selected to be driven, the direction of the write current passed to the write lines 6X and 6Y is determined in accordance with the memory cell 12 to be written and binary information.

In such a manner, the current drives 123 and 133 are driven to supply the write current in the desired direction to the desired write lines 6X and 6Y. The memory cell 12 is unconditionally selected, and bit data is written in accordance with the direction of the write current.

Figure 10:
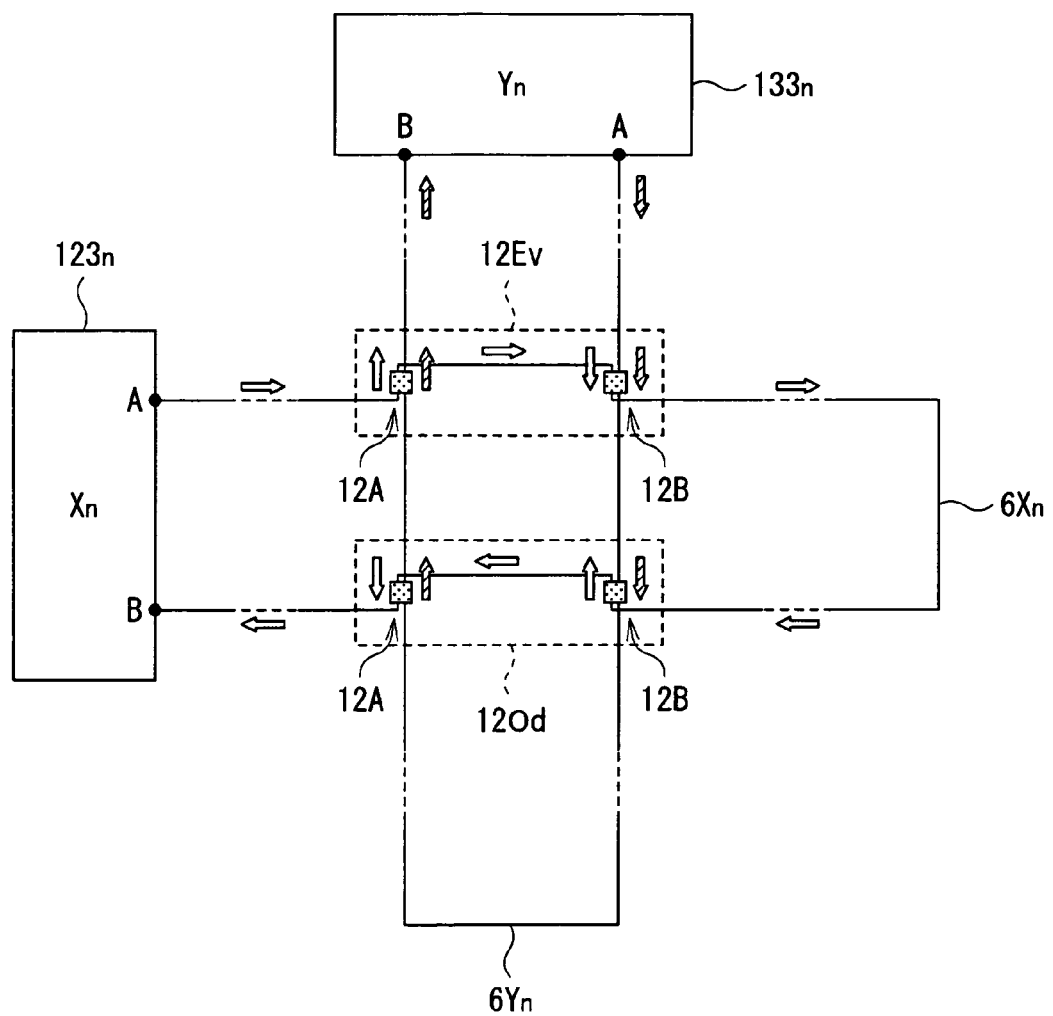
FIG. 10 is a diagram illustrating operation performed at the time of writing "1" into a memory cell in an even-numbered address in the write circuit system of FIG. 4.

For example, in the case of writing "1" to the memory cell 12Ev belonging to the memory cell group 12Ev of an even-numbered address in the corresponding pair of memory cells 12 by using the current drives 123n and 133n, the current drives 123n and 133n are driven in accordance with the logic shown in FIG. 5. That is, as shown in FIG. 10, the current drives 123n and 133n operate to pass current in the direction from the drive point A to the drive point B.

Figure 11:
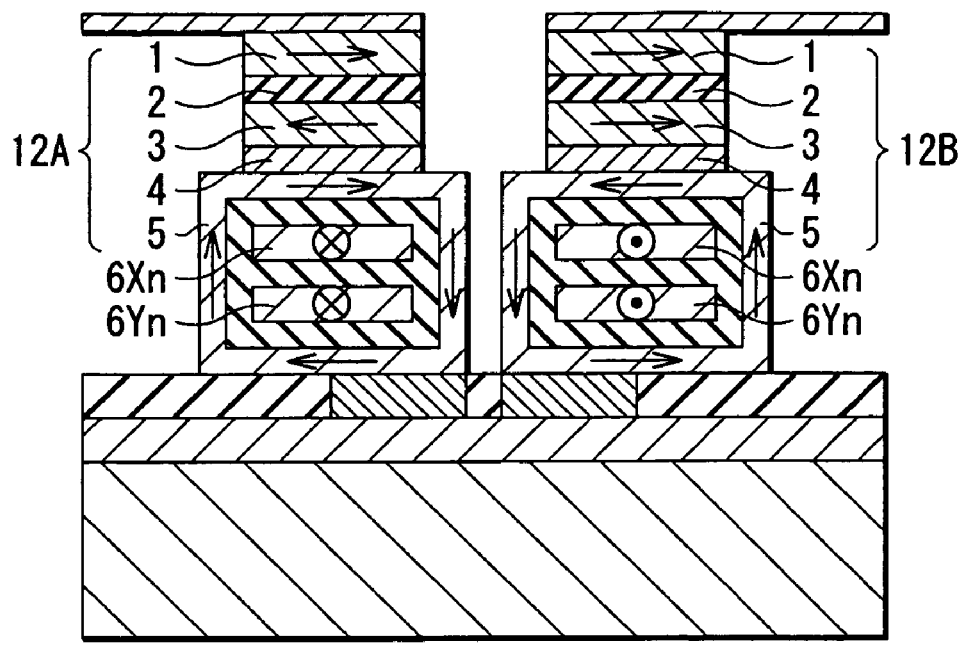
FIG. 11 is a cross section showing a storing state in which data is written in the memory cell illustrated in FIG. 10.

At this time, by the bending of the write line 6Xn, write currents flow with their directions are aligned in each of the areas of the magnetoresistive devices 12A and 12B of the memory cell 12Ev, and with their direction in the magnetoresistive device 12A and that in the magnetoresistive device 12B opposite to each other. By the write current, in the magnetoresistive devices 12A and 12B of the memory cell 12Ev, the magnetic fields re-circulating in opposite directions as shown in FIG. 11 are induced to each toroidal magnetic layer 5, and the magnetization directions (that is, the directions of the induced magnetic field) in the surface facing the second magnetic layer 3 become anti-parallel with each other. The magnetization directions of the second magnetic layer 3 of the magnetoresistive devices 12A and 12B enter an anti-parallel state in which they are opposite to each other in accordance with the direction of the magnetic field supplied from the outside, and this state is fixed by antiferromagnetic coupling with the toroidal magnetic layer 5. In this case, the magnetoresistive device 12A has high resistance, and the magnetoresistive device 12B has low resistance.

On the other hand, in the area in each of the magnetoresistive devices 12A and 12B on the side of the memory cell 12Od, write currents opposite to each other flow in the write lines 6Xn and 6Yn. The write currents in opposite directions cancel off the induced magnetic fields, so that data is not written in the magnetoresistive devices 12A and 12B. In such a manner, write currents are supplied simultaneously to the pair of memory cells 12 (12Ev and 12Od) and data is selectively and properly written only to the memory cell 12Ev.

Figure 12:
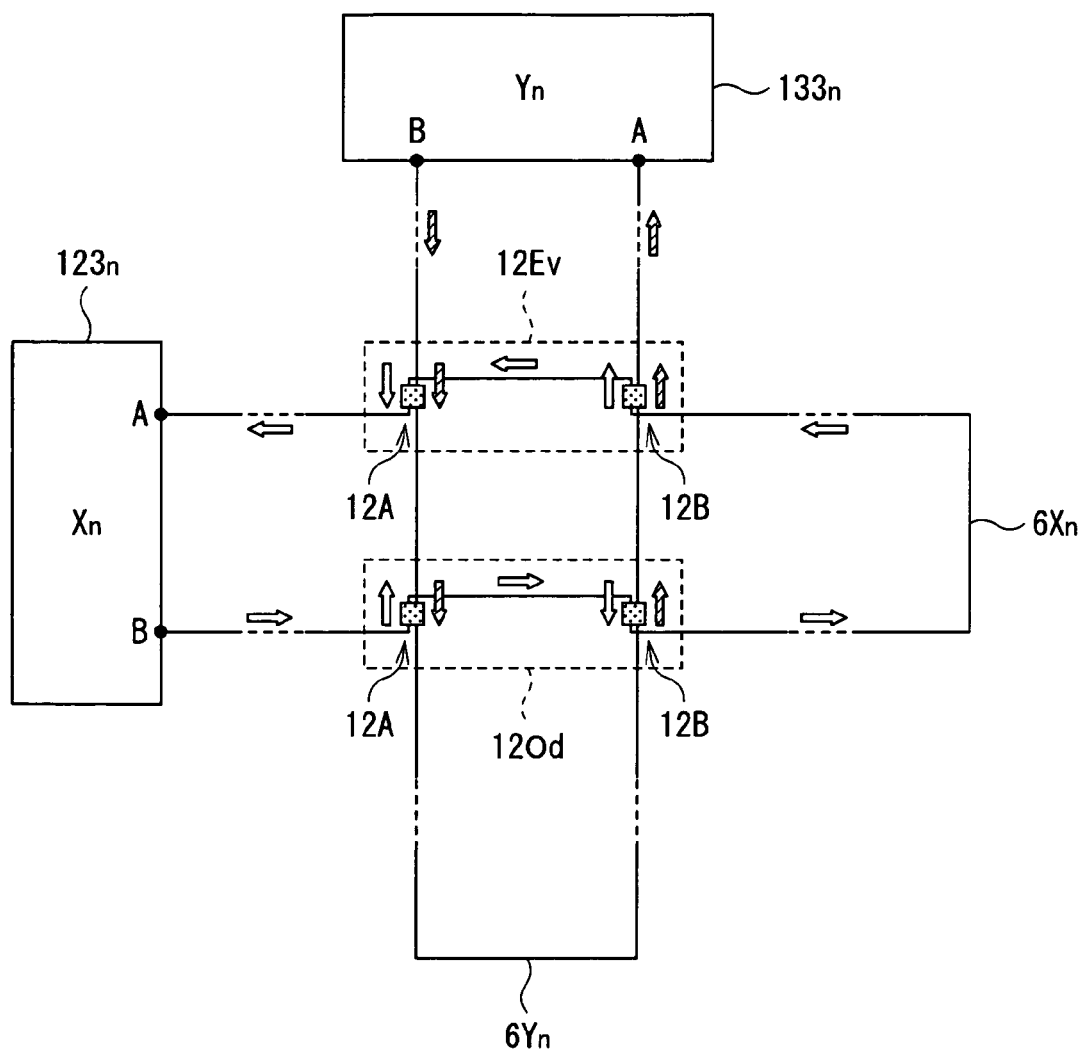
FIG. 12 is a diagram showing operation performed at the time of writing "0" into the memory cell in an even-numbered address in the write circuit system of FIG. 4.
Figure 13:
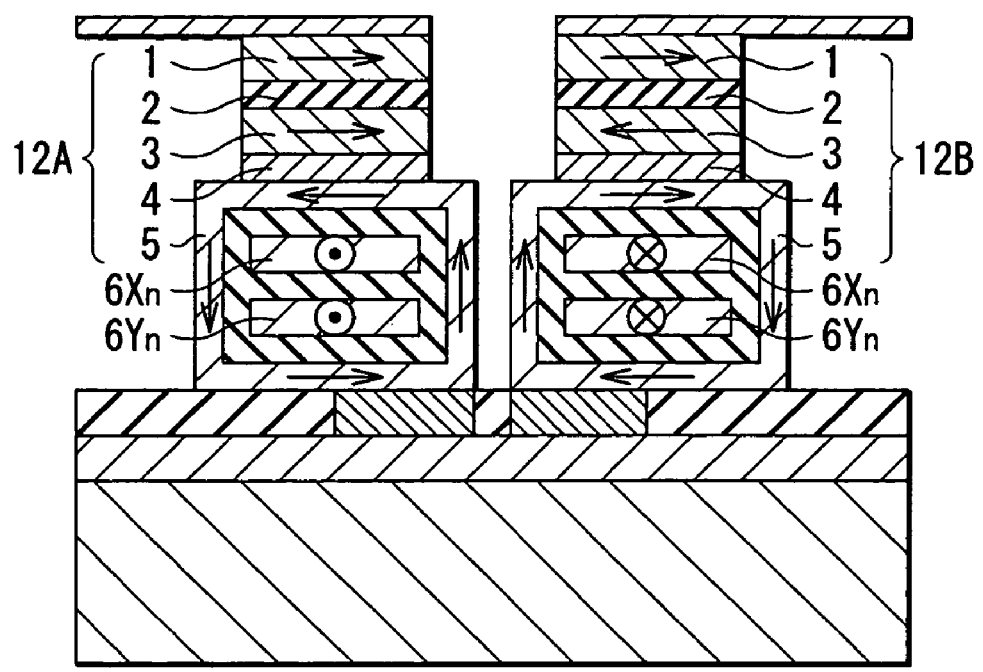
FIG. 13 is a cross section showing another storing state in which data is written in the memory cell illustrated in FIG. 12.

To write "0" into the memory cell 12Ev belonging to the memory cell group Ev of the even-numbered address, as shown in FIG. 12, the current drives 123n and 133n pass currents in the direction from the drive point B to the drive point A. That is, the current direction is opposite to that in the case of writing "1". At this time as well, on the side of the memory cell 12Ev, write currents of the same direction flow in such a manner that the direction of the current in the magnetoresistive device 12A and that in the magnetoresistive device 12B are opposite to each other. The induced magnetic fields by the write currents re-circulate in the toroidal magnetic layers 5 as shown in FIG. 13, and the magnetization directions of the second magnetic layers 3 of the magnetoresistive devices 12A and 12B become anti-parallel with each other so as to be opposite to each other. In this case, therefore, the magnetoresistive devices 12A and 12B operate as if their positions in the case of writing "1" are changed, and the magnetoresistive device 12A has low resistance, and the magnetoresistive device 12B has high resistance.

In this case as well, in the areas of the magnetoresistive devices 12A and 12B on the side of the memory cell 12Od, the write currents flow in opposite directions in the write lines 6Xn and 6Yn, so that data is not written.

Figure 14:
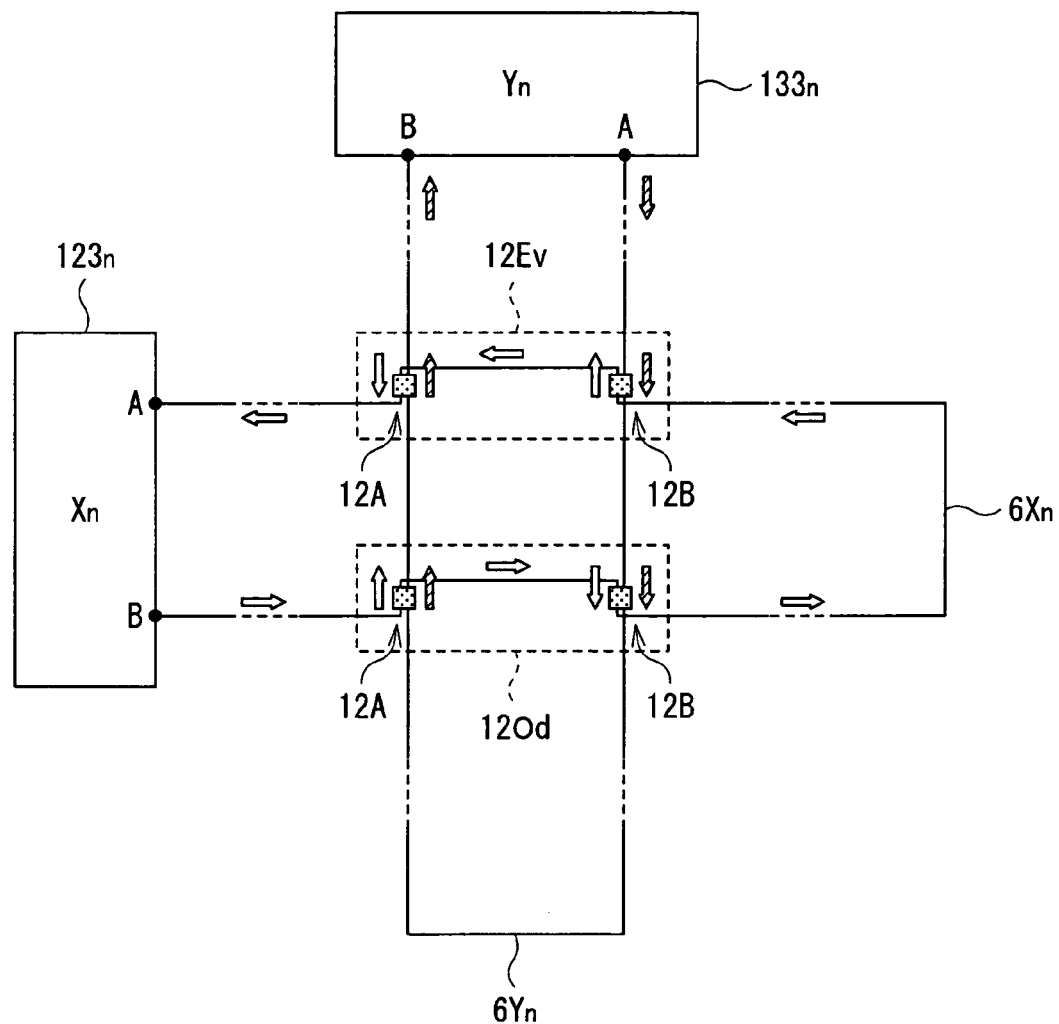
FIG. 14 is a diagram showing operation performed at the time of writing "1" into the memory cell in an odd-numbered address in the write circuit system of FIG. 4.

To write "1" in the memory cell 12Od belonging to the memory cell group Od of the odd-numbered address, as shown in FIG. 14, the current drive 123n passes currents to the write line 6Xn in the direction from the drive point B to the drive point A. The current drive 133n passes currents to the write line 6Yn in the direction from the drive point A to the drive point B. That is, the current direction is opposite to that in the case of writing "1". At this time, as shown in FIG. 11, the writing operation is performed in such a manner that write currents of the same direction flow on the side of the memory cell 12Od, and the direction of the write current in the magnetoresistive device 12A and that in the magnetoresistive device 12B are opposite to each other. On the side of the memory cell 12Ev, write currents in the opposite directions flow in the write lines 6Xn and 6Yn and in the areas of the magnetoresistive devices 12A ad 12B, so that no data is written.

Figure 15:
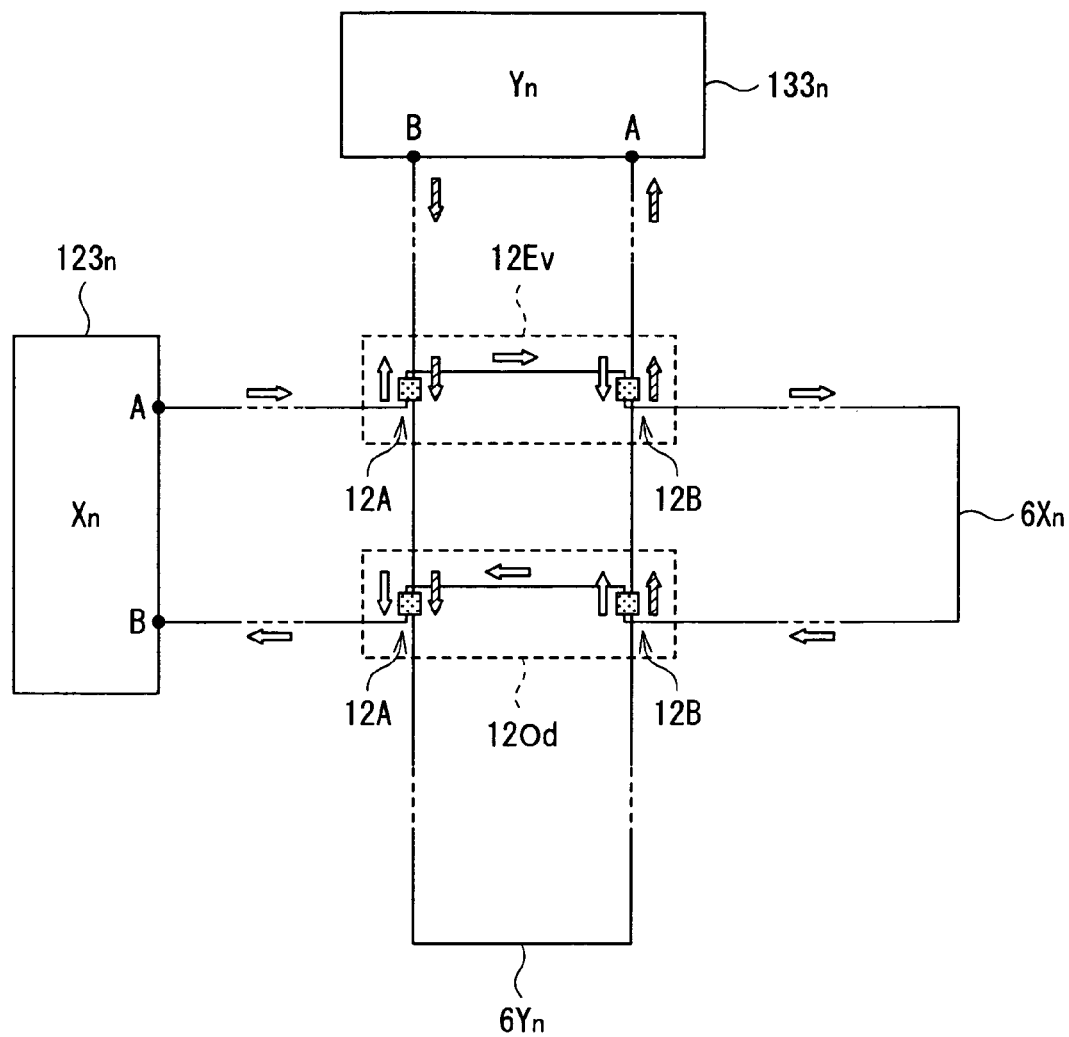
FIG. 15 is a diagram showing operation performed at the time of writing "0" into the memory cell in an odd-numbered address in the write circuit system of FIG. 4.

To write "0" in the memory cell 12Od belonging to the memory cell group Od of the odd-numbered address, as shown in FIG. 15, the write currents are supplied in the directions opposite to those in FIG. 14. Specifically, the current drive 123n passes currents to the write line 6Xn in the direction from the drive point A to the drive point B. The current drive 133n passes currents to the write line 6Yn in the direction from the drive point B to the drive point A. At this time, the writing operation as shown in FIG. 13 is performed on the side of the memory cell 12Od. At this time as well, on the side of the memory cell 12Ev, write currents in the opposite directions flow in the write lines 6Xn and 6Yn in the areas of the magnetoresistive devices 12A ad 12B, so that no data is written.

By controlling the directions of write currents to be passed to the pair of write lines 6Xn and 6Yn as described above, either "1" or "0" is written in one of the pair of memory cells 12Ev and 12Od. Although the case where the write lines 6Xn and 6Yn are selected has been described here, information is written in wiring pairs other than the write lines 6X and 6Y by a similar driving method. Although the cell state shown in FIG. 11 corresponds to "1" and the cell state shown in FIG. 13 corresponds to "0" in the above description, "1" and "0" may correspond to the cell states oppositely.

In this case, the induced magnetic fields in the write lines 6X and 6Y are generated so as to be directed only to the magnetization inversion direction of the second magnetic layer 3. In the second magnetic layer 3, therefore, the magnetization can be inverted in the predetermined direction by a single-direction magnetic field applied. By the operation, writing can be performed with reliability. Since the magnetic field components by the write lines 6X and 6Y are in the same direction and confined in the toroidal magnetic layer 5, the intensity of the effective magnetic field contributing to the inversion of the magnetization of the second magnetic layer 3 becomes higher as compared with that in the conventional technique. As a result, the magnetization of the second magnetic layer 3 can be inverted with sufficient magnetic field intensity, and the magnetizations of the second magnetic layers 3 can be aligned in a predetermined direction. Since the induced magnetic fields are not leaked to the outside of the device 12A (12B) to be written because of the shield effect of the toroidal magnetic layer 5, the possibility that the magnetization direction of the second magnetic layer 3 in the neighboring memory cell 12 is disturbed by an external disturbing magnetic field decreases. Information which is once written can be prevented from being unexpectedly erased or rewritten.

The configuration and the operation of a read circuit system in the magnetic memory device will now be described.

Configuration of Reading Circuit

Figure 16:
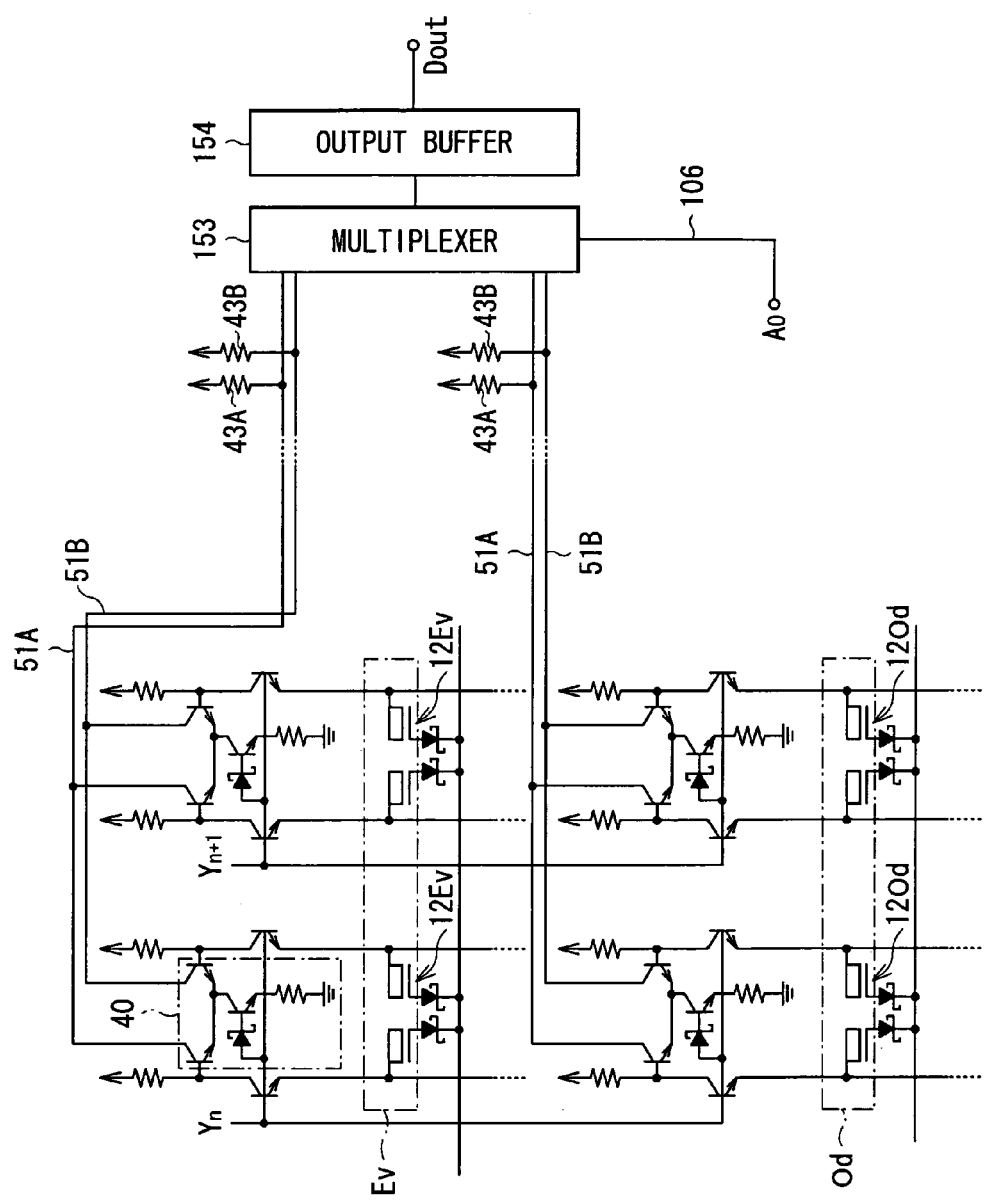
FIG. 16 is a configuration diagram of a main part of a read circuit system of the magnetic memory device shown in FIG. 1.
Figure 17:
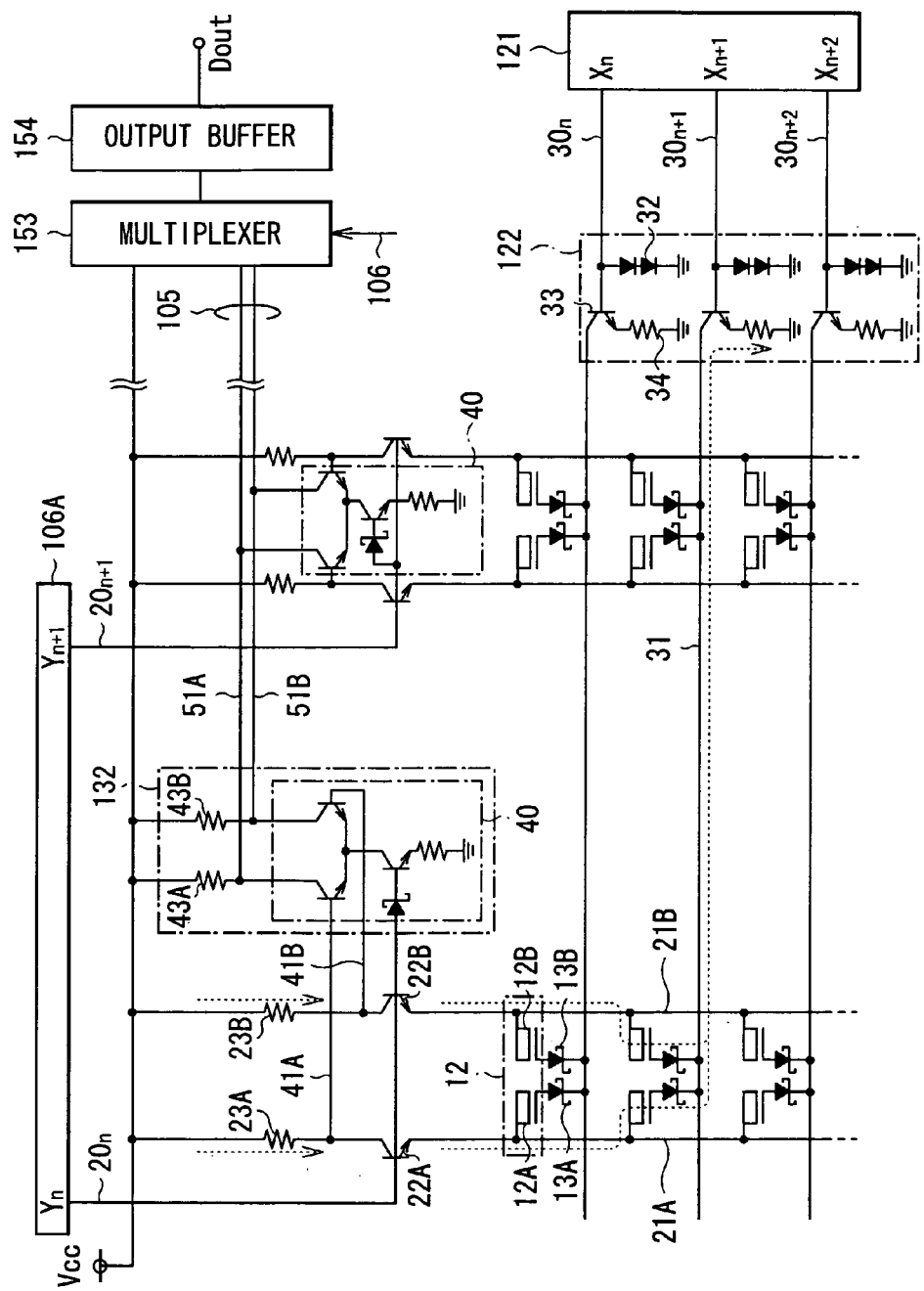
FIG. 17 is a configuration diagram showing a whole read circuit system illustrated in FIG. 16.

FIG. 16 shows a circuit portion corresponding to FIG. 2 of the read circuit system of the magnetic memory device. FIG. 17 shows a general circuit related to reading operation of one of read circuits divided in two systems for even-numbered addresses and odd-numbered addresses of memory cells. As described above, the two circuit systems are similarly constructed with respect to the configuration and the operation, so that one system will be described mainly with reference to FIG. 17.

The read circuit system is a differential amplifier in which each of the memory cells 12 is constructed by a pair of magnetoresistive devices 12A and 12B. Information in each of the memory cells 12 is read by outputting the difference between sensing currents passed to the magnetoresistive devices 12A and 12B. The sensing current is current that flows from the sense bit lines 21A and 21B to the magnetoresistive devices 12A and 12B and flows out to a common sense word decode line 31.

In the memory cell group 140, wiring in a matrix is conducted by the sense word decode lines 31 (hereinafter, simply called sense word lines) arranged in the X direction and the pair of sense bit lines 21A and 21B arranged in the Y direction. Each memory cell 12 is disposed in the intersecting position of the word decode line 31 and the bit decode line 21. The memory cells 12 connected in parallel with the common sense bit lines 21A and 21B construct a bit line, and the memory cells 12 cascaded to the common sense word line 31 construct a word line. In one memory cell 12, one ends of the magnetoresistive devices 12A and 12B are connected to the sense bit lines 21A And 21B, respectively, via the read sensing conductors 11, and the other ends are connected to the common sense word line 31 via the backflow prevention diodes 13A and 13B.

On the one end side (power source Vcc side) of the sense bit lines 21A and 21B, resistors 23A and 23B for current/voltage conversion (hereinafter, called resistors 23A and 23B) and the collector and emitter of the transistors 22A and 22B are connected in series. The bit decode line 20 ( . . . , 20n, 20n+1, . . . ) is connected to the base terminal of each of the transistors 22A and 22B, and the transistors 22A and 22B are opened/closed in accordance with the value (bit decode value) of a selection signal input from the bit decode line 20. Sense amplifier input lines 41A and 41B (hereinafter, called input lines 41A and 41B) are led from nodes provided at the end on the side opposite to the power source Vcc of the resistors 23A and 23B in the sense bit lines 21A and 21B, and are connected to the sense amplifier 132.

The sense amplifier 132 takes the form of a differential amplifier, receives the potential of each of the sense bit lines 21A and 21B, amplifies the potential difference, and outputs the resultant. The sense amplifier 132 has a configuration in which bias resistors 43A and 43B are commonly provided, and an amplification part 40 as a circuit part other than the bias resistors 43A and 43B is provided per pair of sense bit lines 21A and 21B. The sense amplifier 132 is cascaded to sense amplifier output lines 51A and 51B (hereinafter, called output lines 51A and 51B). By using the output lines 51A and 51B, the bias resistors 43A and 43B are commonly used. With the configuration, current consumption in the plural sense amplifiers 132 is suppressed.

Outputs from the output lines 51A and 51B are transmitted to the read multiplexer 153 and the output buffer 154 by a read data bus 105. Each of the pairs of the transistors 22A and 22B, resistors 23A and 23B, and the sense amplifiers 132 has to have identical characters.

To each of the sense word lines 31, the memory cells 12 arranged in the same word line are connected (in this case, the backflow prevention diodes 13A and 13B are disposed between the memory cells 12 and the sense word line 31). The portion between the collector and the emitter of the transistor 33 and a current limiting resistor 34 are connected in series to the earth side of the sense word line 31. The word decode line 30 ( . . . , 30n, 30n+1, . . . ) corresponding to the word line Xn on the base side of the transistor 33. The transistor 33 functions as a switch which is turned on/off according to the value (bit decode value) of the selection signal supplied from the X-direction address decoder 121 to the base.

In the embodiment, the constant current circuit 122 is constructed by the diode 32, transistor 33, and current limiting register 34. The constant current circuit 122 has the function of making current flowing in the sense word line 31 constant. In this case, the diode 32 is obtained by connecting two diodes in series.

Reading Operation

In the magnetic memory device, information written in the memory cell 12 is read out as follows.

In each of the memory cells 12 (12Ev and 12Od), the magnetoresistive devices 12A and 12B are in one of the two ways of anti-parallel magnetization, and information is stored. A selection signal that is input to the bit decode line 20 and the word decode line 30 correspond to an upper bit address of the memory cell 12 to be read. That is, when the selection signal designates the Yn column and the Xn row, the signal is input to the Yn-th bit decode line 20n and the Xn-th word decode line 30n in both of the memory cell groups Ev and Od. As a result, the memory cell 12Ev in the Yn column and the Xn row in the memory cell group Ev and the memory cell 12Od in the Yn column and the Xn row in the memory cell group Od are simultaneously selected. Therefore, the following operation is performed in both of the memory cell groups Ev and Od.

When the voltage level in the bit decode line 20n is set to be "high", the transistors 22A and 22B become conductive, and sensing current flows in the Yn-th bit line in the memory cell 12. The sensing current flows downward through the sense bit lines 21A and 21B from the power source Vcc side to the opposite side. On the other hand, when the voltage level in the word decode line 30n is set to be "high", the transistor 33 becomes conductive to allow current to flow into the Xn-th word line in the memory cell 12.

Therefore, the sensing current flows from the Yn-th sense bit lines 21A and 21B via the magnetoresistive device 12A, backflow prevention diode 13A, magnetoresistive device 12B, and backflow prevention diode 13B to the Xn-th sense word line 31. Further, the sensing current passes between the collector and emitter of the transistor 33 as a component of the constant current circuit 122, and is passed from the current control resistor 34 to the ground.

Information is read by detecting the difference between resistance values of the magnetoresistive devices 12A and 12B in the memory cell 12 as a difference of tunnel currents flowed. The currents flowing in the magnetoresistive devices 12A and 12B are almost equal to the sensing currents flowing in the sense bit lines 21A and 21B. The values of the sensing currents are converted to voltages by voltage drops in the resistors 23A and 23B connected in series to the sense bit lines 21A and 21B and can be detected. The voltage drops in the resistors 23A and 23B are taken from input lines 41A and 41B, and the difference between the voltage drops is detected as a read signal. As described above, by taking the difference between the output values by using the two magnetoresistive devices 12A and 12B, a large output value from which noise is removed can be obtained from the memory cell 12.

The voltage signals taken from the input lines 41A and 41B are amplified by the sense amplifier 132, so that an output of a larger value and an excellent S/N ratio is obtained. Only sense amplifiers 132 corresponding to the bit line out of the plural sense amplifiers 132 become active simultaneously with selection of the bit decode line 20. Therefore, only outputs of the corresponding sense amplifiers 132 are transmitted to the output lines 51A and 51B.

Outputs of the sense amplifiers 132 (132Ev and 132Od) are supplied via the output lines 51A and 51B and the read data bus 105 finally to the read multiplexer 153 and the output buffer 154. In the read multiplexer 153, one of the output of the sense amplifier 132Ev and the output of the sense amplifier 132Od is selected according to the address selection signal $A_0$ input via the group selection signal line 106, and input to the output buffer 154. The output buffer 154 amplifies the input signal voltage and outputs the resultant as a binary signal from the external data terminals D0 to D7. In such a manner, an output of the memory cell 12 to be read is output as a read data signal (Dout) to the outside.

In the reading operation, the magnitude of the sensing current for the selected memory cell 12 is set to be within a predetermined range by the constant current circuit 122. That is, the current flowing in the sense word line 31 or the total of current flowing in the sense bit lines 21A and 21B or the magnetoresistive devices 12A and 12B have the value in the predetermined range. Accordingly, each of the current values is obtained by dividing the current amount normalized to be constant in accordance with the resistance ratio of the magnetoresistive devices 12A and 12B. Consequently, even if the resistance values of the magnetoresistive devices 12A and 12B vary, fluctuations in the current in each of the sense bit lines 21A and 21B are always suppressed within a predetermined range in accordance with the total current value, and a stable differential output can be obtained.

The backflow prevention diodes 13A and 13B provided on the current paths of the magnetoresistive devices 12A and 12B prevent the current from flowing back from the sense word line 31 to the magnetoresistive devices 12A and 12B. Therefore, the path in which a current component flowing back the magnetoresistive device 12A (12B) is generated is interrupted to contribute to improvement in the S/N ratio of a read signal.

As described above, in the embodiment, the loop-shaped write lines 6X and 6Y are provided separately from the read lines, so that current can be passed in two ways in both of the write lines 6X and 6Y. Further, the write line 6X is bent in a rectangular wave shape to form a parallel portion in which the write lines 6X and 6Y are parallel with each other. The magnetoresistive device 12A (12B) is disposed in the parallel portion, and the parallel magnetic fields generated by the parallel write currents are applied to the second magnetic layer 3. Consequently, information is written by applying the magnetic field in a single direction corresponding to the magnetization inversion direction to the second magnetic layer 3. Therefore, the magnetization directions of the second magnetic layers 3 can be efficiently aligned to one direction, and the control on the magnetization direction of the magneto-sensitive layer can be performed more reliably as compared with the conventional technique. At the same time, by inverting the direction of the applied magnetic field to the opposite direction, the magnetization direction of the second magnetic layer 3 can be also inverted to the opposite direction almost perfectly, and the tunnel resistance change ratio can be made higher as compared with the conventional technique.

In the writing method, the magnetization direction of the second magnetic layer 3 is forcedly aligned to the direction of the applied magnetic field. Therefore, the magnetic property of the second magnetic layer 3 is determined in relation with the magnitude of the applied magnetic field. In other words, the second magnetic layer 3 can be formed without considering control on the magnetic property in relation with the magnitude of the applied magnetic field, the yield in manufacture of the magnetic memory device is improved, and productivity can be increased greatly.

Four parallel portions are provided in the pair of write lines 6X and 6Y, the magnetoresistive devices 12A and 12B are disposed in the two parallel portions on the upper side of the write line 6X, thereby forming the memory cell 12Ev of an even-numbered address. The magnetoresistive devices 12A and 12B are disposed in the two parallel portions on the lower side, thereby forming the memory cell 12Od of an odd-numbered address. Thus, the memory cells 12 read by differential sensing are integrated efficiently. In the write circuit system, by selecting one of the write lines 6X and 6Y, the write current flows simultaneously to both of the memory cells 12Ev and 12Od. By selecting the direction of current in each of the write lines 6X and 6Y in advance by the write logic controller 152, desired binary information can be written only in a selected cell without writing information to the other cell. Specifically, in the selected cell, current flows in parallel in the write lines 6X and 6Y and the magnetic fields are generated so as to enhance each other. On the other hand, in a not-selected cell, currents flow in the anti-parallel directions in the write lines 6X and 6Y, and the induced magnetic fields are cancelled out. Since the magnitudes of the write currents flowing in the write lines 6X and 6Y are made equal to each other, the cell selection can be performed with reliability, and the current drives 123 and 133 can have the same configuration.

The current drives 123 and 133 are constructed in such a manner that the both ends of the loop-shaped write lines 6X and 6Y are connected to the drive points A and B, (1) current is passed while changing the direction in accordance with the data signals XDin and YDin, and (2) the amount of current flowed from the write lines is controlled to be constant. Thus, the current of predetermined magnitude can be supplied in two ways to the write lines 6X and 6Y irrespective of variations in resistance. Therefore, in the magnetic memory device, the constant current can be always used to write information to each of the memory cells 12. Reliably writing by an induced magnetic field with sufficient strength and suppression of a magnetic field leaked to a neighboring memory cell 12 within a set range can be performed with excellent controllability, and stable writing operation can be performed. Since (2) it is assured that the value of the write current is constant irrespective of resistance fluctuations and the like of each write line 6, there are also advantages such that resistance variations in the write line are permitted (within a certain range), the allowable range of manufacture errors is widened, and the flexibility of the wiring structure of a write line increases.

Further, in the magnetic memory device, the read circuit system is constructed by the circuits of two systems by the memory cell group 12Ev and the memory cell group 12Od, the bit decode line 20 and the word decode line 30 are selected in a manner similar to selection of the write lines 6X and 6Y. Thus, the whole device can be controlled on the basis of an even-numbered address and an odd-numbered address of the memory cell 12. The same drive control circuits can be used for the writing and reading operations.

Second Embodiment

Figure 18:
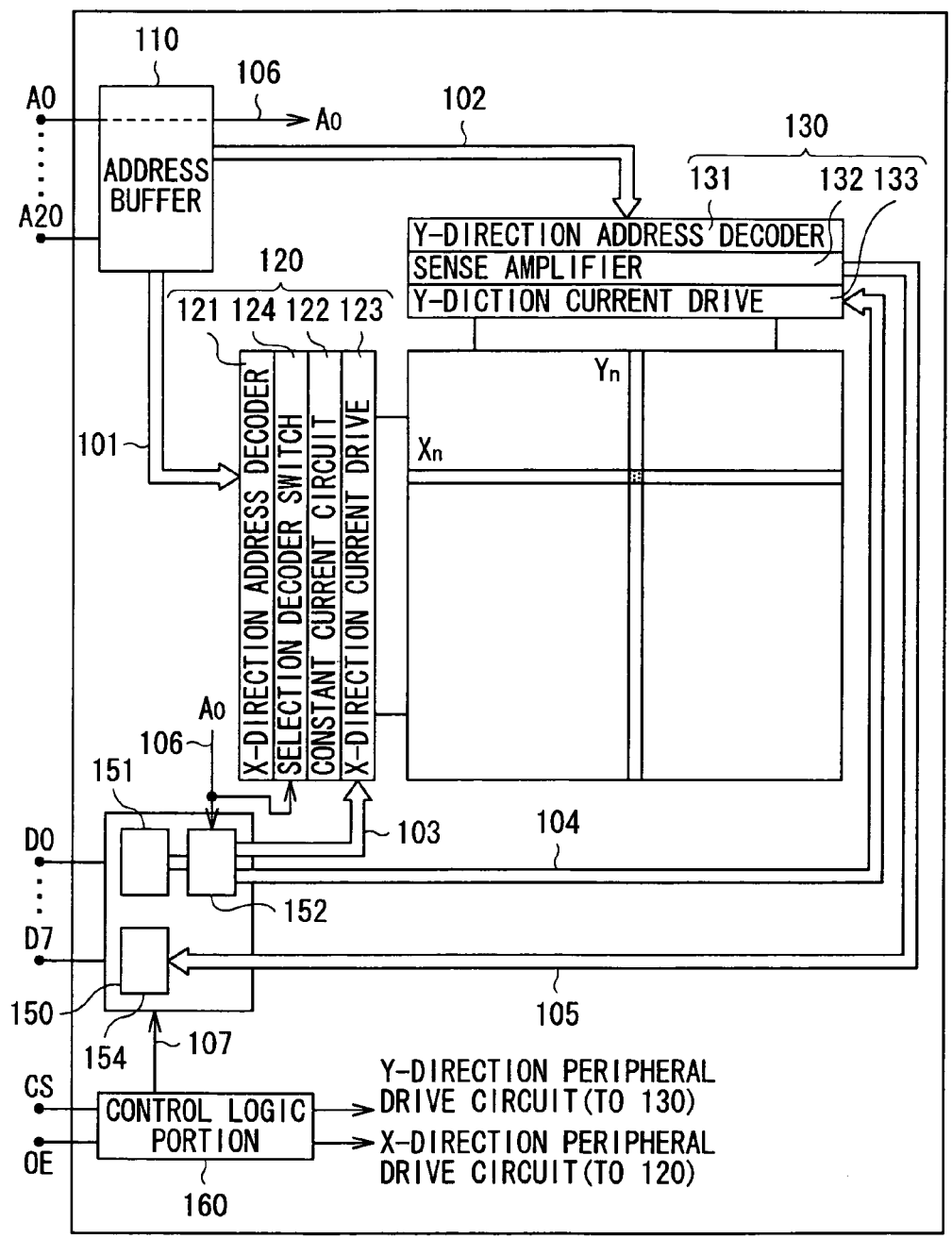
FIG. 18 is a block diagram showing a whole configuration of a magnetic memory device according to a second embodiment of the invention.

FIG. 18 shows the configuration of a whole magnetic memory device according to a second embodiment. In the magnetic memory device, in place of providing the read multiplexer 153, the X-direction peripheral drive circuit 120 is provided with a selection decoder switch 124. The selection decoder switch 124 is provided to receive the address selection signal $A_0$ and to select a memory cell to be sensed in order to select one of the memory cell group 12Ev of an even-numbered address and the memory cell group 12Od of the odd-numbered address. In the second embodiment, the same reference numerals are given to components similar to those in the first embodiment and their description will not be repeated.

Figure 19:
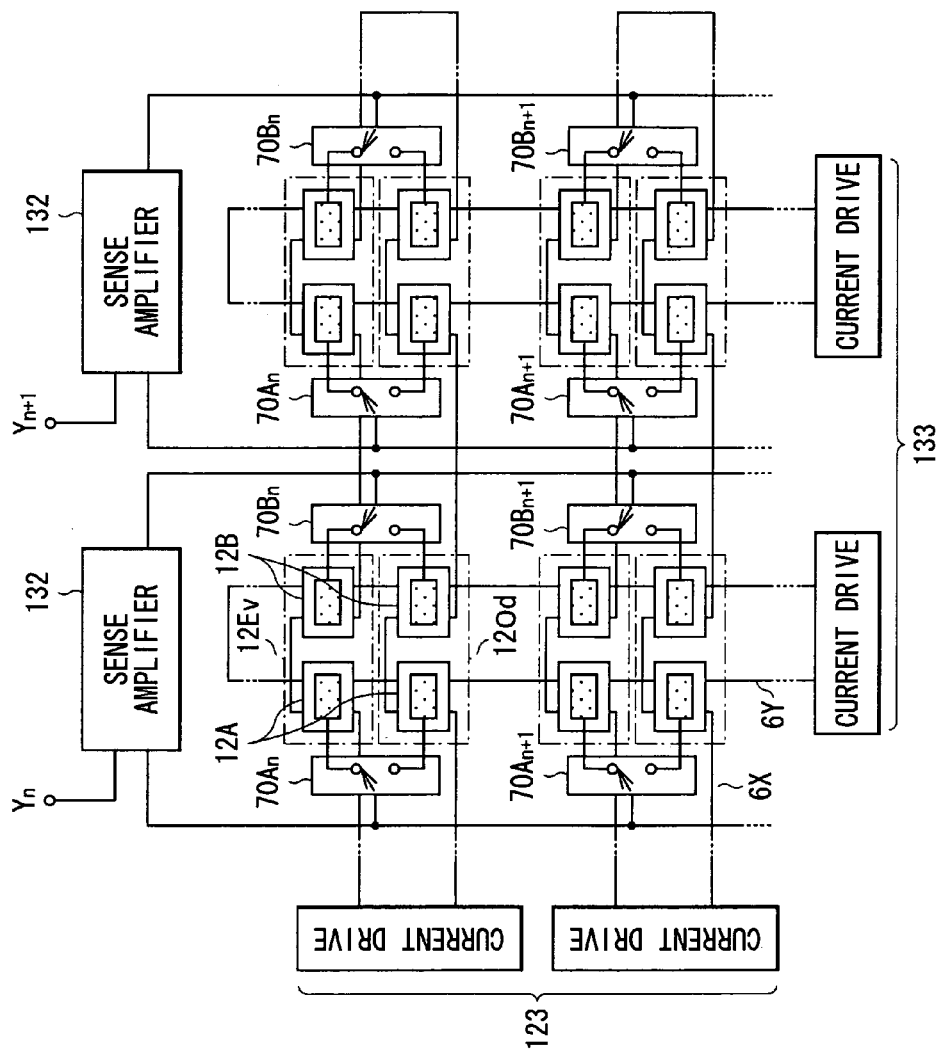
FIG. 19 is a block diagram showing the configuration of a main part of the magnetic memory device illustrated in FIG. 18.

FIG. 19 is a block diagram showing the configuration of a memory cell group, a write circuit system, and a read circuit system. A selection decoder switch 124 is expressed as switches 70A and 70B. The switches 70A and 70B are paired. The switch 70A is disposed on the side of the magnetoresistive device 12A, and the switch 70B is disposed on the side of the magnetoresistive device 12B. The switches 70A and 70B select so as to pass sensing current to one of the pair of memory cells 12Ev and 12Od. The switches 70A and 70B are arranged in the bit line direction like switches 70An and 70Bn, switches 70An+1 and 70Bn+1, . . . and are selected in the word line direction of the memory cell 12 by a word decode value ( . . . , Xn, Xn+1, . . . ).

Figure 20:
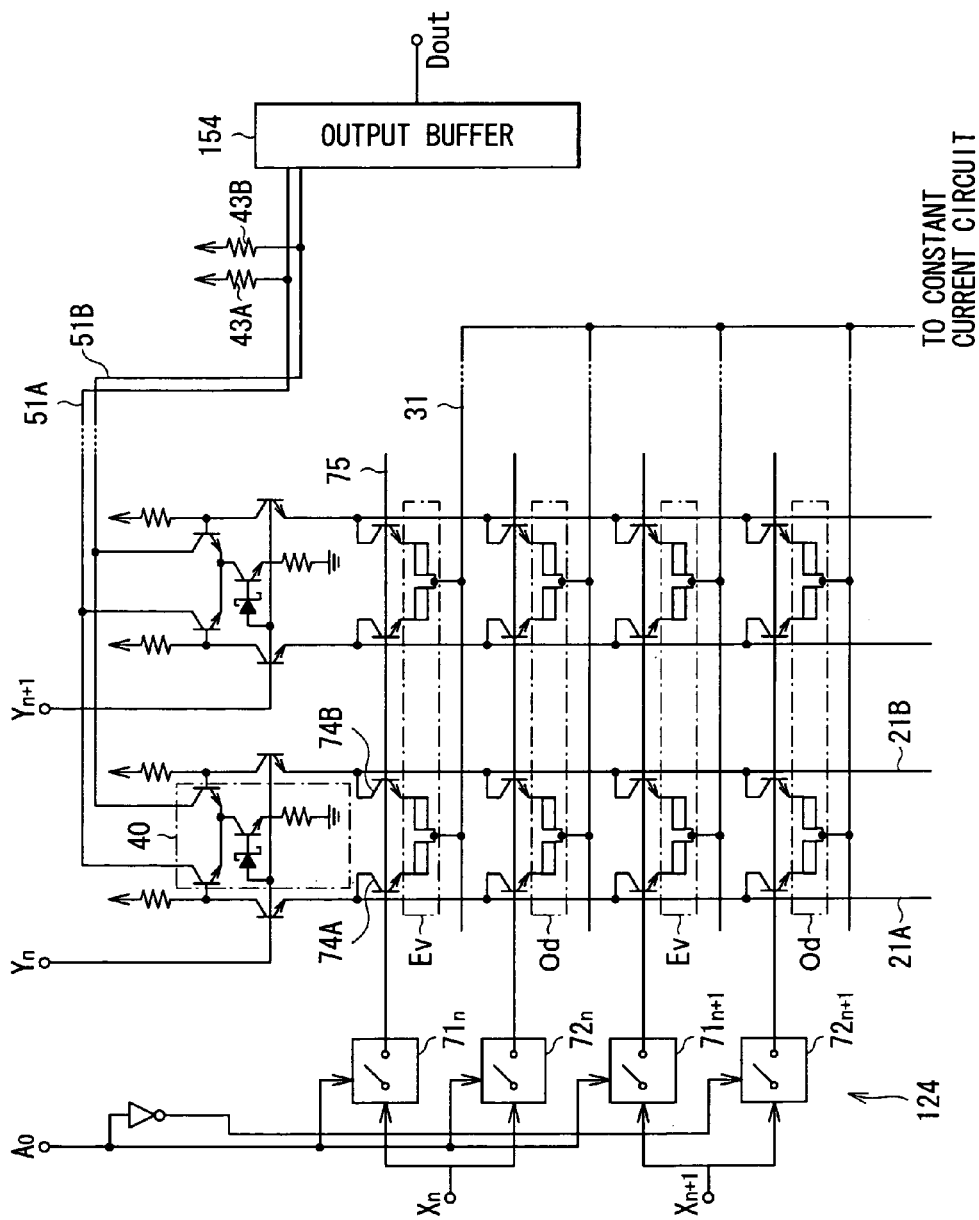
FIG. 20 is a configuration diagram of a main part of a read circuit system of the magnetic memory device illustrated in FIG. 18.

FIG. 20 is a circuit diagram showing a concrete configuration of the read circuit system corresponding to FIG. 19. The read circuit system of the embodiment is obtained by combining the memory cell groups Ev of even-numbered addresses and the memory cell groups Od of odd-numbered addresses into one system. In this case, the selection decoder switch 124 is constructed by switches 71, 72, an inverter 73, and the like. The switches 71 and 72 correspond to the switches 70A and 70B. The switches 71 and 72 are switches of two control commands by a word decode value and the address selection signal $A_0$ and select a word line of the memory cell groups Ev and Od as an object to be read.

To the switches 71 ( . . . , 71n, 71n+1, . . . ) and switches 72 ( . . . , 72n, 72n+1, . . . ), the word decode lines 30 ( . . . , 30n, 30n+1, . . . ) are connected every pair. All of the switches 71 are connected to the input line of the address selection signal $A_0$. All of the switches 72 are connected to the input line via the inverter 73 for inverting signals. Further, the switches 71 and 72 are connected to word selection lines 75 of the memory cell groups Ev and Od, respectively.

The word selection lines 75 are connected to the base terminals of transistors 74A and 74B of each word line. The collector terminals of the transistors 74A and 74B are connected to the sense bit lines 21A and 21B and the emitter terminals are connected to the read sensing conductors 11 of the magnetoresistive devices 12A and 12B. In the first embodiment, the backflow prevention diodes 13A and 13B are provided between the magnetoresistive devices 12A and 12B and the sense word line 31. In the second embodiment, the transistors 74A and 74B have the blocking functions in place of the backflow prevention diodes 13A and 13B by their switch-on/switch-off operations. In the second embodiment, the sense word lines 31 are commonly connected to one constant current circuit.

In the read circuit system, information is read as follows.

A selection signal from the X-direction address decoder 121 is input to the pair of switches 71 and 72 via the word decode line 30. The address selection signal $A_0$ is input to the switch 71, and an inversion signal of the address selection signal $A_0$ is input to the switch 72. By the signals, only a switch in which both the word decode value corresponding to the address upper bit and the address selection signal $A_0$ corresponding to the address least significant bit are at the "high" level is selected and conducted.

In the word line selected by the switches 71 and 72, the signal voltage of the "high" level is applied to the word selection line 75. As a result, the transistors 74A and 74B are made conductive to allow the current to flow from the sense bit lines 21A and 21B to the corresponding sense word line 31.

On the other hand, to the bit decode line 20, a selection signal from the Y-direction address decoder 131 is input. A signal of the "high" level is input to the base of each of the transistors connected to the bit decode line 20 in correspondence with the bit decode value, and the transistors are conducted. Consequently, the sense amplifier 132 of the bit line according to the bit decode value becomes operative and the sensing current is passed to the sense bit lines 21A and 21B.

Therefore, in the circuit system, only one memory cell 12 to be read is identified by the selection decoder switch 124 as the memory cell 12 to be sensed, and only one sensing result is output.

In the second embodiment as described above, in place of dividing the read circuit system into two systems and providing the read multiplexer 153, one read circuit system is provided and the selection decoder switch 124 is provided. Consequently, selection of a cell from the memory cells 12Ev and 12Od is performed prior to sensing, and the sensing is performed only the memory cell 12 to be read. Therefore, the read circuit system is controlled by the bit decode value, the word decode value, and the address selection signal $A_0$ in a manner similar to the write circuit system and, since current consumption is reduced, can operate more efficiently. The other effects are similar to those of the first embodiment.

The second embodiment is different from the first embodiment with respect to the transistors 74A and 74B and the word selection line 75 which are provided and also read wiring in the memory cell group 140. However, it is also possible to apply the wiring structure of the first embodiment almost as it is by replacing the transistor 33 of the constant current circuit with the switches 71 and 72 of the two control commands. The circuit configurations of the foregoing embodiments are concrete examples. They may be modified without changing the functions, or other circuit configurations may be also employed.

The present invention is not limited to the foregoing embodiments but can be various modified. For example, in the embodiment, the case of forming four parallel portions by the pair of write lines 6X and 6Y and disposing the magnetoresistive device 12A (12B) in each of the parallel portions has been described. However, it is sufficient to dispose the first and second write lines in the invention so that (1) a parallel portion is formed by bending at least one of the write lines, and (2) at least one of the write lines is disposed in a loop shape. Wiring structures other than that in the embodiments can be also employed.

Figure 21A:
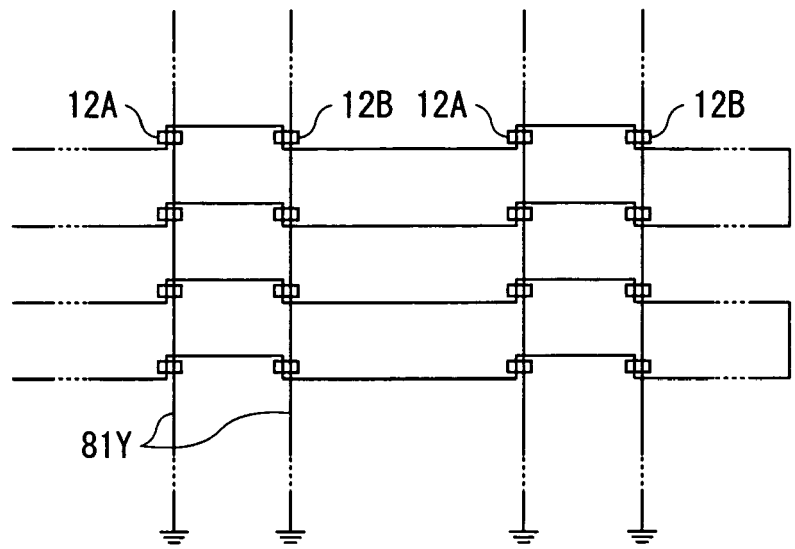
FIGS. 21A and 21B are diagrams each showing a modification of a write line in the write circuit system illustrated in FIG. 4.
Figure 21B:
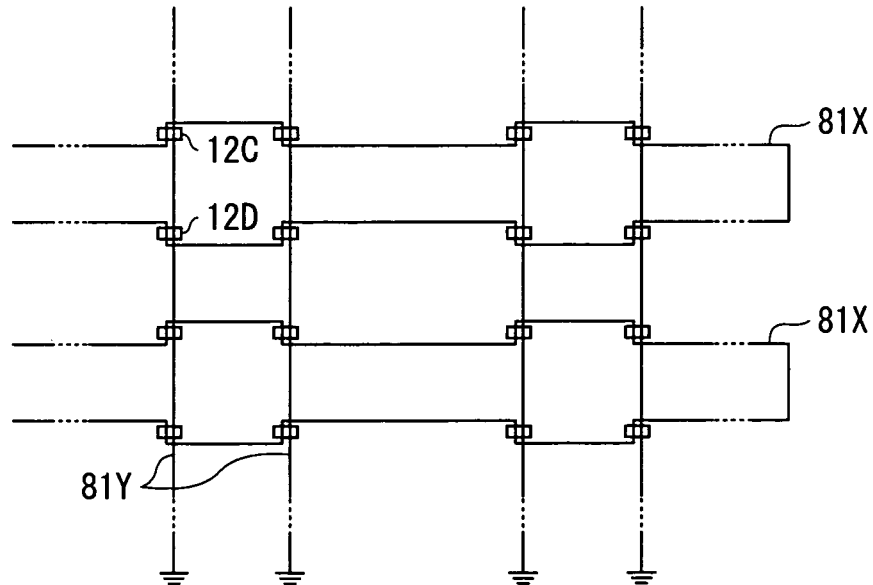

FIGS. 21A and 21B show concrete modifications of the wiring structure of the write lines. In FIG. 21A, write lines 81Y in the Y direction are disposed linearly. By passing currents in opposite directions simultaneously to the neighboring write lines 81, the write lines can be driven as if they form a loop. In a manner similar to the embodiment, one memory cell is formed by the magnetoresistive devices 12A and 12B. By enabling each of the write lines 81Y to be selected independently, each of the magnetoresistive devices 12A and 12B can be operated so as to carry one-unit information as a memory cell. In FIG. 21B, the bending direction of the write line 81 in the X direction in the upper stage and that in the lower stage are made opposite to each other. In this case, magnetoresistive devices 12C and 12D neighboring in the vertical direction along the write line 81Y construct one memory cell.

Figure 22A:
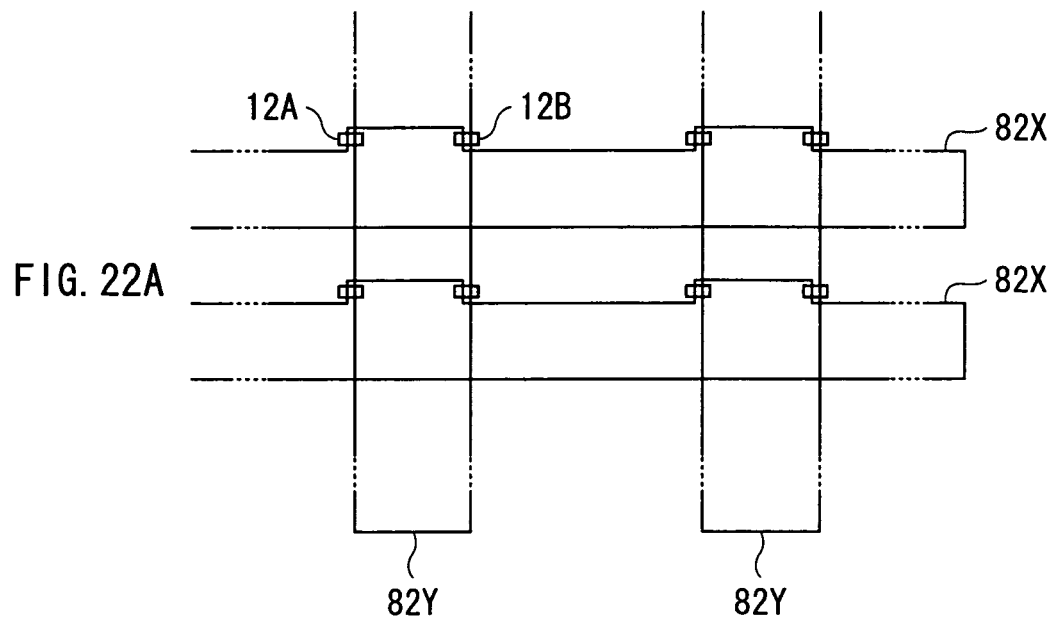
FIGS. 22A and 22B are diagrams each showing a modification of the write line in the write circuit system illustrated in FIG. 4.
Figure 22B:
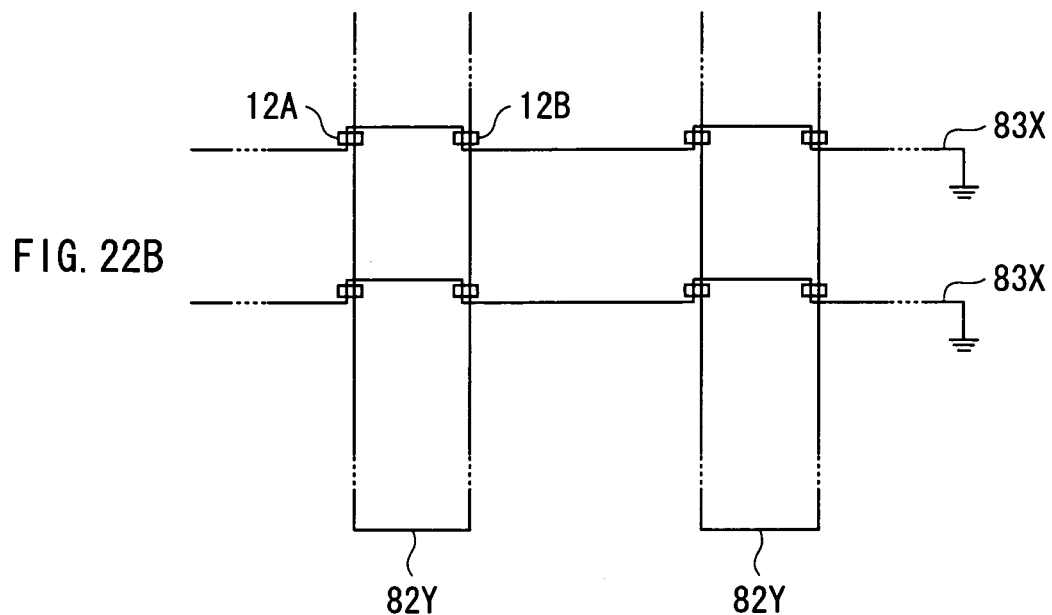

FIGS. 22A and 22B show another modification. In FIG. 22A, looped write lines 82X and 82Y cross each other. One of the upper and lower stages of the write line 82X is bent to form parallel portions. The magnetoresistive devices 12A and 12B are disposed in the parallel portions. In this case as well, the magnetoresistive devices 12A and 12B can be driven as one memory cell. Since the write lines correspond to the memory cells in a one-to-one manner in both of the X and Y directions, driving control is easier as compared with that in the foregoing embodiments. Specifically, when each of current drives in the X and Y directions is selected by a word decode value and a bit decode value which unconditionally correspond to a memory cell to be written and the current supply directions of the current drives are controlled in accordance with data to be written, write current in a predetermined direction is passed to each of the write lines 82X and 82Y.

FIG. 22B shows a modification of FIG. 22A. A write line 83X is a linear line which is the same as the portion in the lower stage with respect to the bent portion of the write line 82X.

Figure 23:
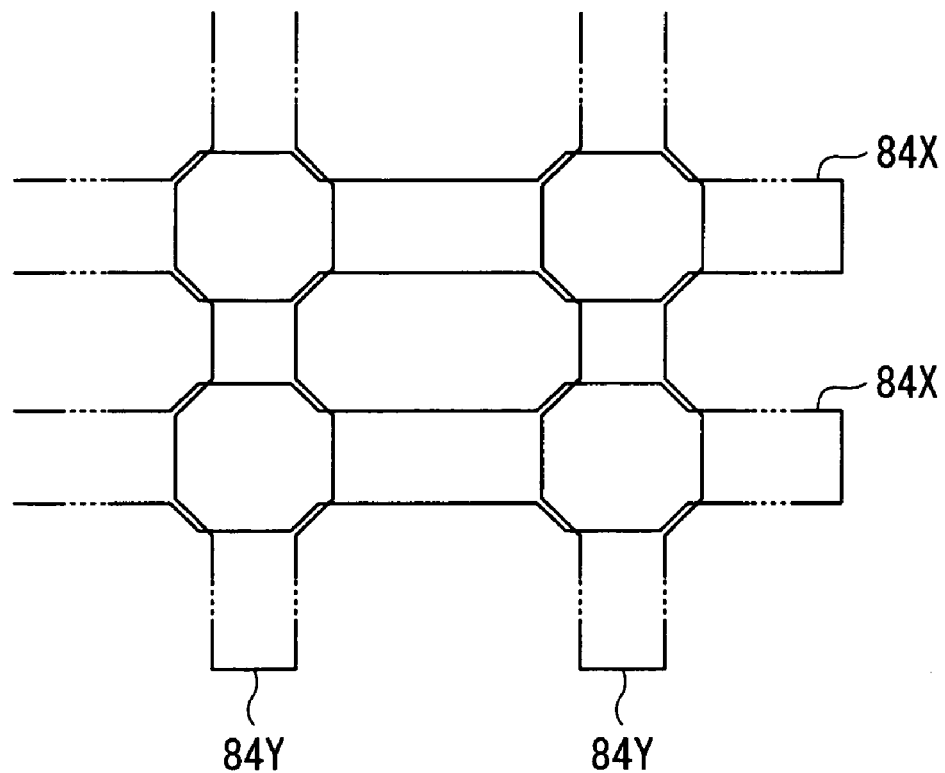
FIG. 23 is a diagram showing a modification of the write line in the write circuit system illustrated in FIG. 4.
Figure 24:
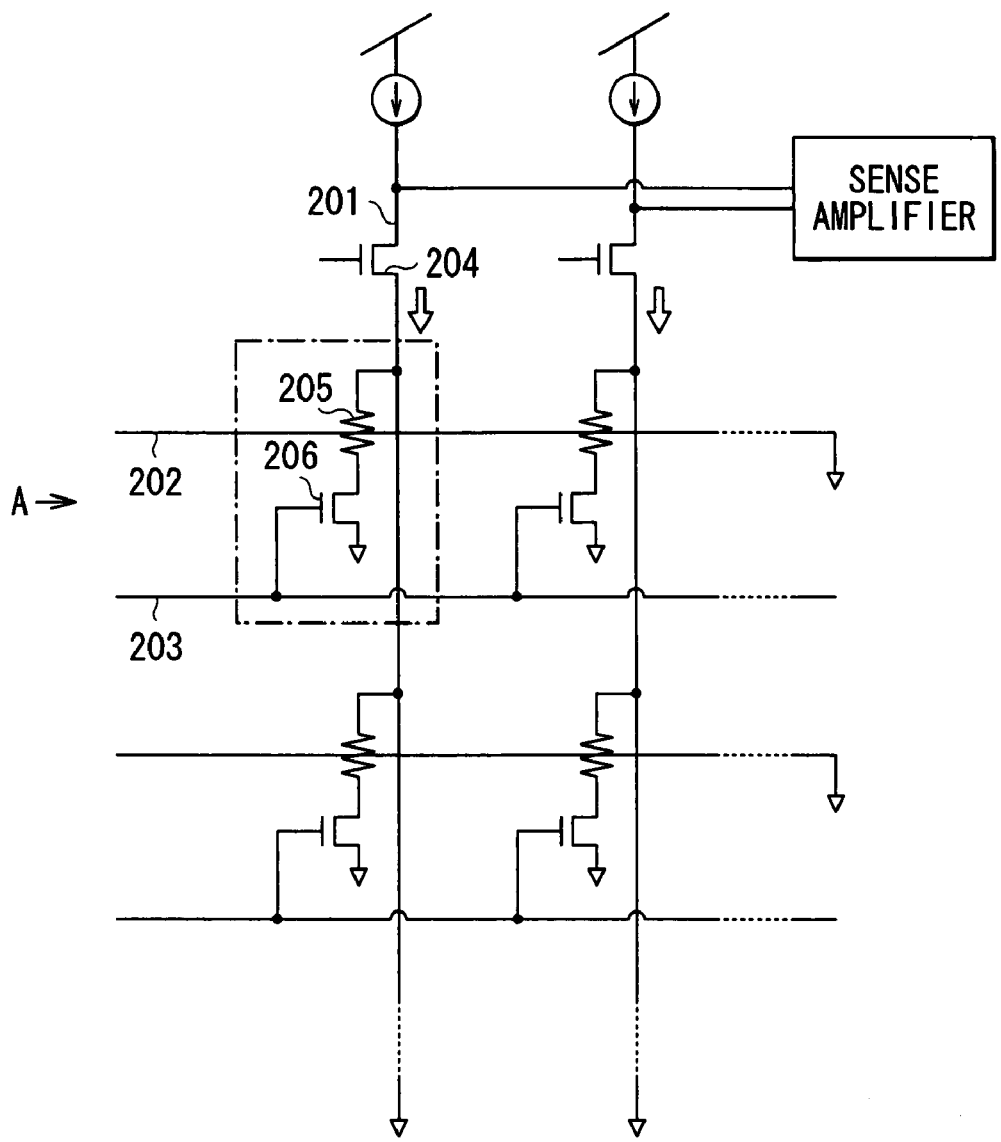
FIG. 24 is a diagram showing the configuration of a conventional magnetic memory device.
Figure 25:
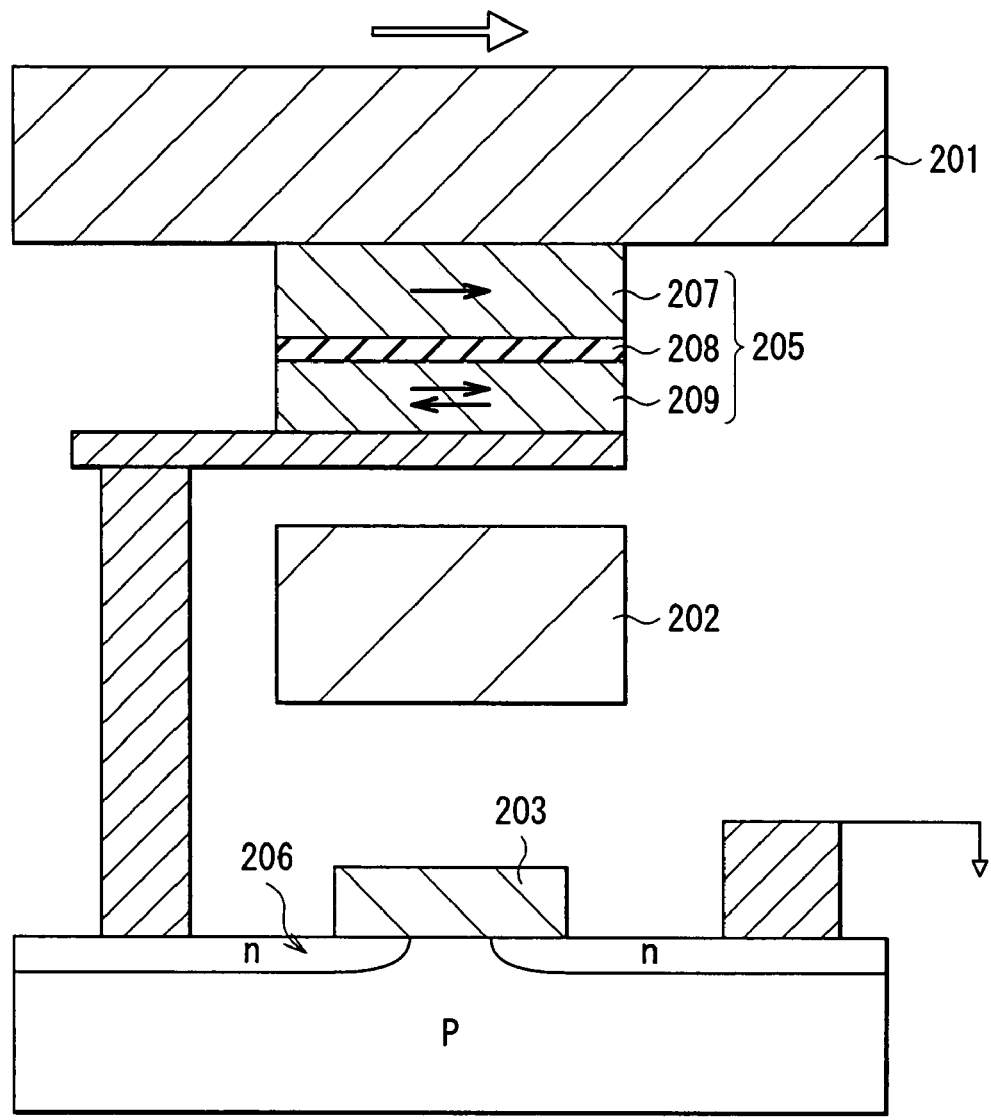
FIG. 25 is a cross section showing a concrete configuration of a conventional magnetic memory device.
Figure 26:
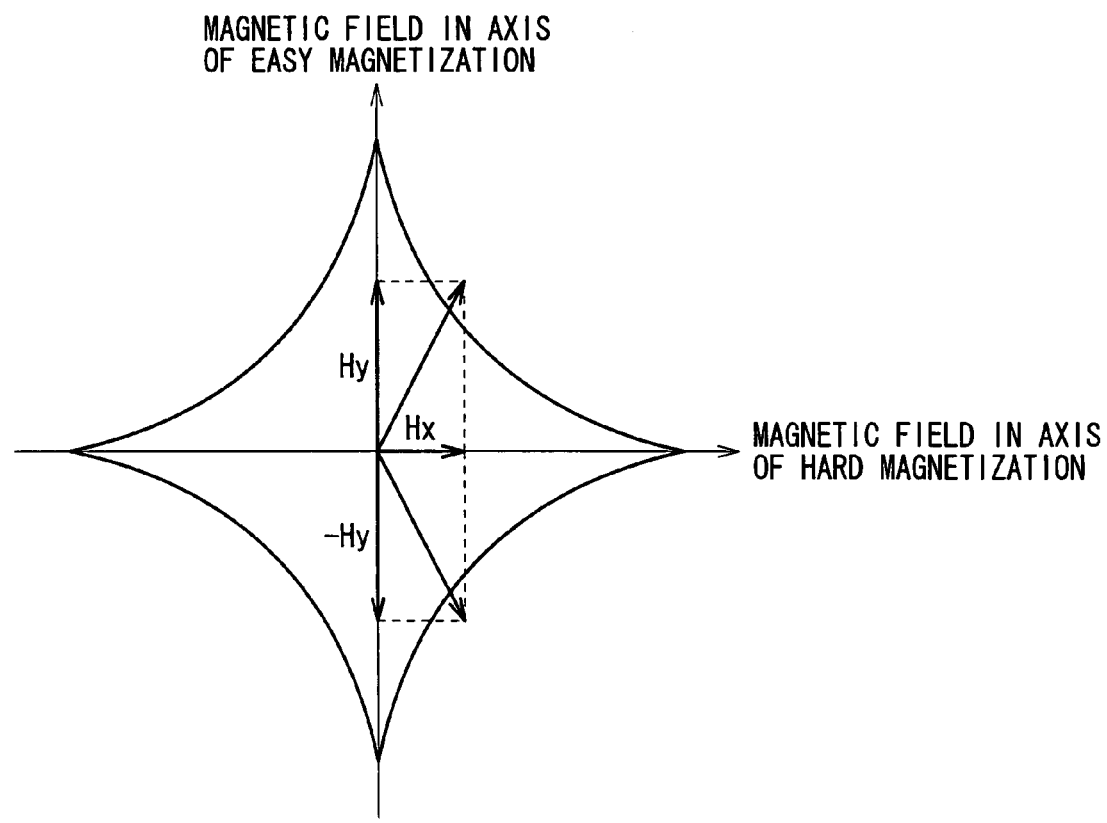
FIG. 26 is a diagram illustrating a method of writing data to the conventional magnetic memory device.
Figure 27:
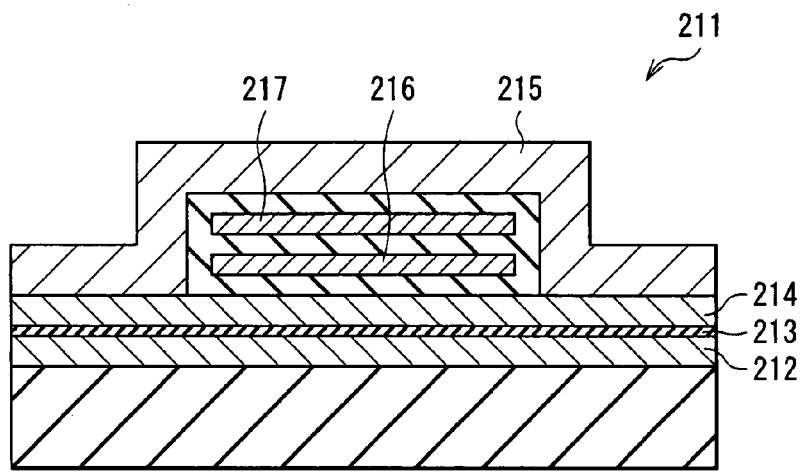
FIG. 27 is a diagram showing a sectional configuration of a magnetic memory device in a modification of a conventional magnetic memory device.
Figure 28:
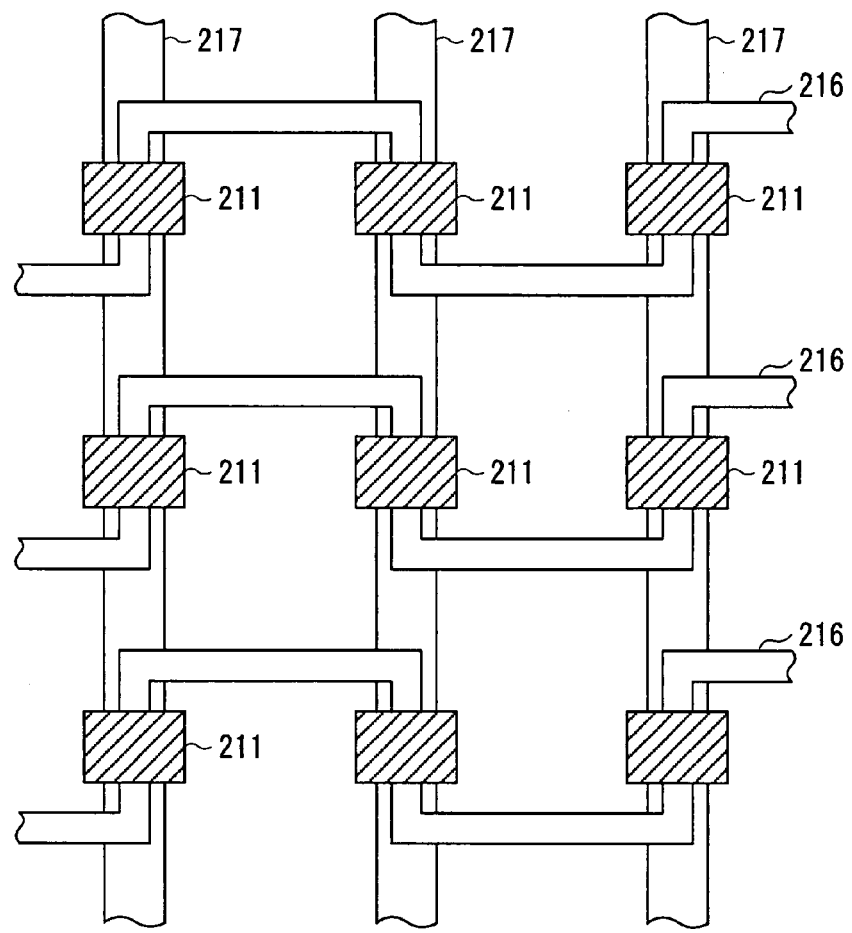
FIG. 28 is a diagram showing a wiring structure of a write line for the magnetic memory device illustrated in FIG. 27.
Figure 29:
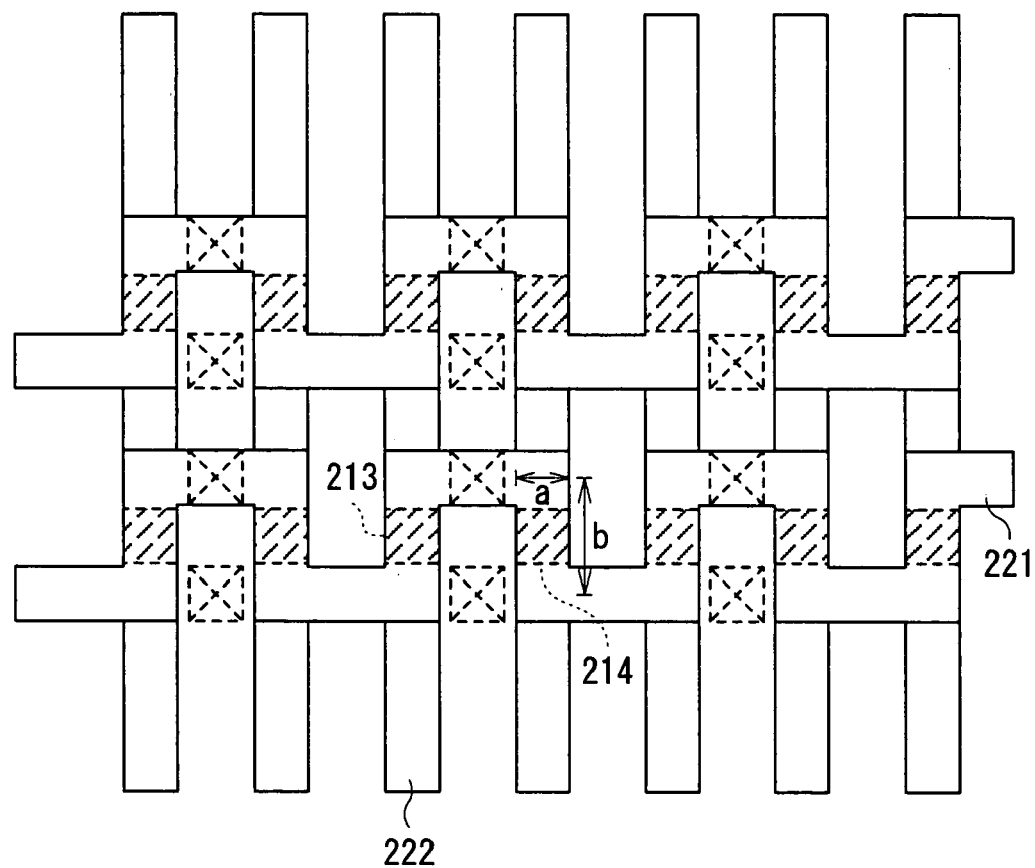
FIG. 29 is a diagram showing the configuration of a write line and a magnetic storing device in a modification of a conventional magnetic memory device.
Figure 30:
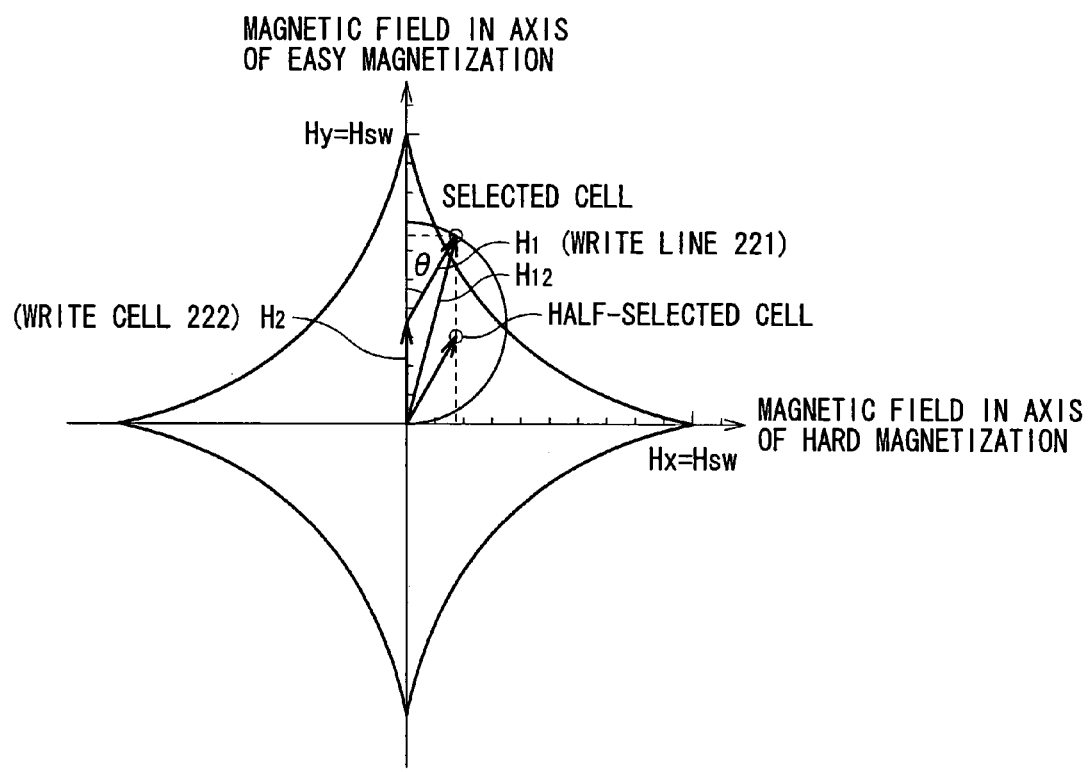
FIG. 30 is a diagram showing a method of writing data to the magnetic storing device illustrated in FIG. 29.

FIG. 23 shows a modification of the case where the write line is bent in a trapezoid wave shape, not in the rectangular wave shape. Both of write lines 84X and 84Y are bent to form parallel portions in the directions inclined from the extending directions of the write lines 84X and 84Y. Magnetoresistive devices disposed in the parallel portions are inclined, so that the cell pitch can be narrowed. Although both of the write liens 84X and 84Y have a loop shape in the diagram, it is also possible to dispose one of the write lines 84X and 84Y linearly and drive the write lines 84X and 84Y in a manner similar to the foregoing other modifications.

In the foregoing embodiment, both of the current drives 123 and 133 have been described as current drives of the present invention. In the magnetic memory device of the invention, however, the current supply circuit is not always limited to the current drive of the invention. Because of the effects produced by making current constant, it is desirable to apply the current drive of the present invention. For example, the wiring structure of FIG. 22A is more excellent than that of FIG. 22B for such a reason and from the viewpoint of layout. With respect to the current drive of the invention, concrete structures of circuit portions corresponding to the current direction controller and the current amount controller are not limited to those in the embodiments but any structures can be employed as long as the functions are embodied. Although the current drives 123 and 133 are constructed by bipolar transistors in the embodiment, they can be constructed by semiconductor devices such as MOS-FETs or CMOSs.

The configuration of the magnetoresistive device does not have to be the same as that in the description of the embodiments. For example, a magnetoresistive device having no toroidal magnetic layer may be also used. Although TMR devices are used as the magnetoresistive devices 12A and 12B in the embodiment, they may be replaced with GMR devices. The elements in this case can be constructed in a manner similar to the magnetoresistive device 12A (12B) except that the nonmagnetic layer 2 is changed from the insulating layer to a nonmagnetic metal layer. As described above, all of known device structures can be applied to the magnetoresistive device of the invention. Any of a CPP (Current Perpendicular to the Plane) structure of passing current perpendicular to the stacked face of a magnetic layer and a CIP (Current Flows in the Plane) structure of passing current in parallel with the stacked face of the magnetic layer may be employed.

Figure 31:
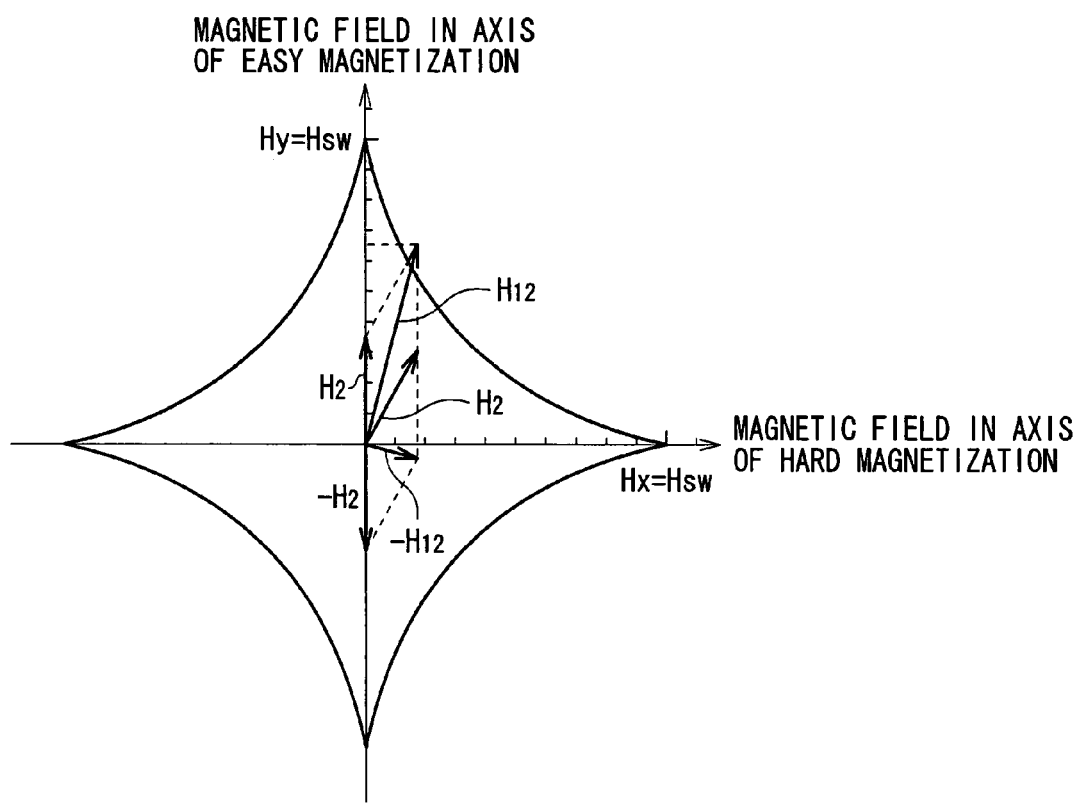
FIG. 31 is a diagram for explaining problems of the writing method illustrated in FIG. 30.

Further, in the foregoing embodiment, the directions of magnetic fields applied to the second magnetic layers 3 are positively aligned at the time of writing data to the magnetoresistive devices 12A and 12B. The present invention can be effective not only to the case where the application magnetic field has only single direction components (the magnetic field components are parallel with each other) but also to the case where the first and second write lines are provided in parallel with each other and the magnetic fields induced to the write lines are not orthogonal to each other. That is, to form two states corresponding to binary signals by inverting the magnetization direction of the magneto-sensitive layer, the application magnetic field has to be inverted by inverting the direction of the write current. Conventionally, when write lines are disposed orthogonal to each other, if current can be passed in two ways to one of the write lines (if one magnetic field component can be inverted), even if the other current direction is fixed (even if the direction of the other magnetic field component is fixed), the application magnetic field can form symmetrical two states for the reason that the magnetic field components are orthogonal to each other. However, when the write lines are disposed in parallel with each other, if the current direction of one of the write lines is fixed, symmetrical magnetic fields corresponding to two states cannot be generated (refer to FIG. 31). That is, when the first and second write lines are provided in parallel with each other, both of them have to be constructed so that current flows in two ways.

Although the action and configuration of the read circuit system have been also concretely described in the foregoing embodiment, the present invention relates to the write circuit system and is not limited by the circuit configuration, wiring layout, and the like of the read circuit system.

As described above, the magnetic memory device of the preset invention includes: a read line to which read current is passed; first and second write lines disposed separately from the read line so that write current can be passed in two ways to each of the first and second write lines, where a parallel portion in which the first and second write lines extend parallel with each other is formed by bending at least one of the first and second write lines; and a magnetoresistive device having a magneto-sensitive layer whose magnetization direction changes according to a magnetic field applied, and disposed in the parallel portion. At least one of the first and second write lines is formed in a loop shape so as to include a bent portion and first and second portions connecting the bent portion and both ends, the magnetization direction of the magneto-sensitive layer changes according to a magnetic field generated by write current flowing in the parallel portion, and information is written. Thus, current can be passed in two ways in both of the first and second write lines. In the magnetoresistive device, the magnetic fields can be generated so as to enhance each other by the write current supplied in parallel or anti-parallel with each other from the first and second write lines, and the magnetization directions of the magneto-sensitive layer can be changed by the magnetic fields.

In particular, both of the first and second write lines are formed in a loop shape, one of the first and second write lines is bent so that both of the first and second portions have a rectangular wave shape or a trapezoid wave shape, and the bending direction of the first portion and that of the second portion coincide with each other, thereby forming four parallel portions in a pair of first and second write lines. A pair of magnetoresistive devices disposed in the two parallel portions provided in the first portion construct a memory cell belonging to a first group, and a pair of magnetoresistive devices disposed in the two parallel portions provided in the second portion construct a memory cell belonging to a second group. With the configuration, irrespective of the arrangement that the memory cell in the first group and the memory cell in the second group are disposed so as to share write lines, by controlling the write current directions in two ways, the memory cells can be written independently of each other. Therefore, while constructing memory cells each constructed by a pair of magnetoresistive devices so as to be drivable, the memory cells can be integrated efficiently.

Further, the magnetic memory device further comprises a write current drive circuit including: a current direction controller to which both ends of a write line having a loop shape as one of the first and second write lines are connected and which controls the direction of the write current in the write line in two ways; and a current amount controller for controlling the amount of write current in the write line to a constant value, and supplying the write current to the write line. When such a write current drive circuit is used, irrespective of the resistance value of a current path, the write current having always the constant magnitude can be supplied to the write line in a predetermined direction. Therefore, irrespective of fluctuations in the resistance values in write lines and the like, stable writing operation can be performed.

By making magnetic fields generated by the write current supplied to the first and second write lines applied to the magneto-sensitive layer so as to be in the same direction in a memory cell to be written, the writing efficiency can be improved, the magnetization direction of the magneto-sensitive layer can be controlled with reliability, and an excellent write state can be realized. Moreover, a large read signal output can be obtained.

In the method of writing a magnetic memory device of the invention, first and second write lines are provided separately from a read line, and write current can be passed in two ways. At least one of the first and second write lines is formed in a loop shape including first and second portions connecting a bent portion and both ends. A parallel portion in which the first and second write lines extend parallel with each other is formed by bending at least one of the first and second write lines and making the first and second write lines cross each other. The magnetoresistive device is disposed in the parallel portion. Write current is supplied to the first and second write lines so that both of the write currents flowing in the first and second write lines in the parallel portion are in one of first and second directions corresponding to write information. By changing the magnetization direction of the magneto-sensitive layer by a magnetic field generated by the write currents, information is written. Thus, the write current can be supplied in the direction according to information to be written out of the two ways to both of the first and second write lines, and the magnetic fields which can invert the directions can be generated and applied to the magneto-sensitive layers. Therefore, by generating the application magnetic fields so as to enhance each other by the write currents in the first and second write lines, the magnetization directions of the magneto-sensitive layers can be disposed in two anti-parallel directions, and binary information can be written in an excellent write state.

Further, both of the first and second write lines are formed in a loop shape, the first and second portions of one of the first and second write lines are bent in a rectangular wave shape or a trapezoid wave shape so that their bending directions coincide with each other, four parallel portions are provided in a pair of first and second write lines, a pair of magnetoresistive devices are disposed in two parallel portions provided in the first portion, thereby constructing a memory cell belonging to a first group. A pair of magnetoresistive devices is disposed in two parallel portions provided in the second portion, thereby constructing a memory cell belonging to a second group. Write current is supplied to the pair of first and second write lines so that current flows in the same direction in the first and second write lines in both of the two parallel portions and, moreover, current flows in opposite directions in the two parallel portions in a memory cell to be written as one of two memory cells belonging to the first and second groups. Write current is supplied to the first and second write lines so as to flow in opposite directions in both of the two parallel portions in the other cells, thereby changing a magnetization direction of each of the magneto-sensitive layers only in the pair of magnetoresistive devices in one of the memory cells, and selectively writing information. Proper writing can be performed on a memory cell constructed by a pair of magnetoresistive devices so as to read information in the differential amplifying method, and the memory cell in the first group and the memory cell in the second group disposed on the same write line are not simultaneously selected but writing can be selectively performed on one of the memory cells.

When information is written by supplying the write current to the first and second write lines and applying the magnetic fields in the same direction to the magneto-sensitive layers, the magnetization of the magneto-sensitive layer is inverted to the direction of the applied magnetic field. Therefore, writing can be performed efficiently, the magnetization direction of the magneto-sensitive layer can be controlled with reliability, and an excellent write state can be realized. Accordingly, a large read signal output can be obtained.

Further, when magnitudes of the magnetic fields applied to the magneto-sensitive layer are equalized, it is possible to easily and reliably enable writing in the case where the magnetic fields are aligned in a single direction and enhance each other, and disable writing in the case where the magnetic fields are in opposite directions and cancel each other out.

The invention claimed is:

1. A magnetic memory device comprising:
a read line to which read current is passed;
first and second write lines disposed separately from the read line so that write current can be passed in two ways to each of the first and second write lines, where a parallel portion in which the first and second write lines extend parallel with each other is formed by bending at least one of the first and second write lines; and
a magnetoresistive device having a magneto-sensitive layer whose magnetization direction changes according to a magnetic field applied, and disposed in the parallel portion,
wherein at least one of the first and second write lines is formed in a loop shape so as to include a bent portion and first and second portions connecting the bent portion and both ends,
the magnetization direction of the magneto-sensitive layer changes according to a magnetic field generated by write current flowing in the parallel portion, and information is written.

2. A magnetic memory device according to claim 1, wherein the parallel portion is formed by bending one of the first and second portions into a rectangular wave shape or a trapezoid wave shape.

3. A magnetic memory device according to claim 1, wherein the parallel portion is formed by bending both of the first and second portions into a rectangular wave shape or a trapezoid wave shape.

4. A magnetic memory device according to claim 3, wherein the direction of bending the first portion and that of the second portion coincide with each other.

5. A magnetic memory device according to claim 2, wherein a pair of magnetoresistive devices construct one memory cell.

6. A magnetic memory device according to claim 1, wherein both of the first and second write lines are formed in a loop shape,
  one of the first and second write lines is bent so that both of the first and second portions have a rectangular wave shape or a trapezoid wave shape, and the bending direction of the first portion and that of the second portion coincide with each other, thereby forming four parallel portions in a pair of first and second write lines,
  a pair of magnetoresistive devices disposed in the two parallel portions provided in the first portion construct a memory cell belonging to a first group, and
  a pair of magnetoresistive devices disposed in the two parallel portions provided in the second portion construct a memory cell belonging to a second group.

7. A magnetic memory device according to claim 6, further comprising a write logic controller for receiving address information indicating the first or second group to which a memory cell to be written belongs and write information to be written, and selecting the direction of write current supplied to the first and second write lines on the basis of the address information and the write information.

8. A magnetic memory device according to claim 1, further comprising a write current drive circuit including: a current direction controller to which both ends of a write line having a loop shape as one of the first and second write lines are connected and which controls the direction of the write current in the write line in two ways; and a current amount controller for controlling the amount of write current in the write line to a constant value, and supplying the write current to the write line.

9. A magnetic memory device according to claim 7, further comprising a write current drive circuit including: a current direction controller to which both ends of a write line having a loop shape as one of the first and second write lines are connected and which controls the direction of the write current in the write line in two ways; and a current amount controller for controlling the amount of write current in the write line to a constant value, and supplying the write current to the write line,
  wherein the direction of write current supplied to the first and second write lines selected by the write logic controller is output as direction control information for controlling a current direction to the current direction controller, and the current direction controller controls the direction of write current in the write line on the basis of the direction control information.

10. A magnetic memory device according to claim 8, wherein the current direction controller includes:
  a first differential switch pair constructed by first and second current switches provided for both ends of the write line and operating so that one of the first and second current switches is open and the other is close; and
  a second differential switch pair constructed by third and fourth current switches provided in correspondence with the first and second current switches, respectively, and operating so that one of the third and fourth current switches is open and the other is close,
  the first differential switch pair has the function of selecting one of both ends of the write line as a write current inflow side, and the second differential switch pair has the function of selecting the other one of the both ends of the write line as a write current outflow side.

11. A magnetic memory device according to claim 10, wherein the current direction controller includes a differential controller for performing a control so that the first and fourth current switches are in the same open/close state, and the second and third current switches are in the state opposite to the state of the first and fourth current switches.

12. A magnetic memory device according to claim 5, wherein magnetic fields generated by the write current flowing in the parallel portion of the first and second write lines are applied to the magneto-sensitive layer so as to be in the same direction in the memory cell to be written.

13. A magnetic memory device according to claim 12, wherein the magnetoresistive device is disposed in an area where a magnetic field is generated only in a direction orthogonal to the parallel portion, in the parallel portion.

14. A magnetic memory device according to claim 1, wherein the magnetoresistive device further comprises a stacked body including the magneto-sensitive layer, and
  an toroidal magnetic layer is provided on one of the faces of the stacked body, the toroidal magnetic layer using a direction along the stacked face as an axial direction, and the parallel portion of the first and second write lines penetrating the toroidal magnetic layer along the axial direction.

15. A magnetic memory device according to claim 1, wherein magnitudes of the magnetic fields generated by the write current supplied to the first and second write lines are equal to each other.

16. A method of writing a magnetic memory device comprising: a read line to which read current is passed; first and second write lines extending so as to cross each other, and a magnetoresistive device having a magneto-sensitive layer whose magnetization direction changes according to a magnetic field generated by write current supplied to the first and second write lines, comprising the steps of:
  disposing the first and second write lines separately from the read line and enabling write current to be passed in two ways;
  forming at least one of the first and second write lines in a loop shape including first and second portions connecting a bent portion and both ends;
  providing a parallel portion in which the first and second write lines extend parallel with each other by bending at least one of the first and second write lines and making the first and second write lines cross each other;
  disposing the magnetoresistive device in the parallel portion;
  supplying write current to the first and second write lines so that both of the write currents flowing in the first and second write lines in the parallel portion are in one of first and second directions corresponding to write information; and
  writing information by changing the magnetization direction of the magneto-sensitive layer by a magnetic field generated by the write currents.

17. A method of writing a magnetic memory device according to claim 16, wherein two magnetoresistive devices are disposed in a pair of the parallel portions,
  write current is supplied to the first and second write lines so that the directions coincide in each of the pair of parallel portions and the directions in the pair of parallel portions are opposite to each other, thereby changing the magnetization directions of magneto-sensitive layers of the two magnetoresistive devices so as to be anti-parallel with each other, and
  information is written by using the two magnetoresistive device as one memory cell.

18. A method of writing a magnetic memory device according to claim 17, wherein both of the first and second write lines are formed in a loop shape, the first and second portions of one of the first and second write lines are bent in a rectangular wave shape or a trapezoid wave shape so that their bending directions coincide with each other, four parallel portions are provided in a pair of first and second write lines, a pair of magnetoresistive devices are disposed in two parallel portions provided in the first portion, thereby constructing a memory cell belonging to a first group, a pair of magnetoresistive devices are disposed in two parallel portions provided in the second portion, thereby constructing a memory cell belonging to a second group, write current is supplied to the pair of first and second write lines so that current flows in the same direction in the first and second write lines in both of the two parallel portions and, moreover, current flows in opposite directions in the two parallel portions in a memory cell to be written as one of two memory cells belonging to the first and second groups, and write current is supplied to the first and second write lines so as to flow in opposite directions in both of the two parallel portions in the other cells, thereby changing a magnetization direction of each of the magneto-sensitive layers only in the pair of magnetoresistive devices in one of the memory cells, and selectively writing information.

19. A method of writing a magnetic memory device according to claim 16, wherein write current is supplied to a write line formed in a loop shape as one of the first and second write lines while controlling the direction of write current by selecting one of both ends as a write current inflow side and selecting the other end as an outflow side, and controlling so that the write current flows on the write lines with a predetermined current value.

20. A method of writing a magnetic memory device according to claim 16, wherein information is written by supplying write current to the first and second write lines and applying magnetic fields in the same direction to the magneto-sensitive layers.

21. A method of writing a magnetic memory device according to claim 20, wherein magnitudes of the magnetic fields applied to the magneto-sensitive layer are equalized.

* * * * *